United States Patent
Amb et al.

(10) Patent No.: US 8,394,917 B2
(45) Date of Patent: *Mar. 12, 2013

(54) SOLUBLE ALTERNATING DONOR-ACCEPTOR CONJUGATED POLYMER ELECTROCHROMES

(75) Inventors: Chad Martin Amb, Gainesville, FL (US); Pierre Marc Beaujuge, Berkeley, CA (US); John R. Reynolds, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 68 days.

This patent is subject to a terminal disclaimer.

(21) Appl. No.: 12/829,903

(22) Filed: Jul. 2, 2010

(65) Prior Publication Data

US 2011/0003967 A1 Jan. 6, 2011

Related U.S. Application Data

(60) Provisional application No. 61/222,653, filed on Jul. 2, 2009.

(51) Int. Cl.
  *C08G 75/00* (2006.01)
(52) U.S. Cl. ......................... 528/377; 528/380
(58) Field of Classification Search .................. 528/380, 528/377
  See application file for complete search history.

(56) References Cited

U.S. PATENT DOCUMENTS 7,256,923 B2  8/2007 Liu et al.
2010/0298527 A1* 11/2010 Beaujuge et al. ............. 528/380

FOREIGN PATENT DOCUMENTS

WO  WO 2009126118  * 10/2008
WO  WO 2009/058877  5/2009

OTHER PUBLICATIONS

Thomas et al. (ACS Symposium Series, 1999, Chap.22, 367-373).*
Meng et al. (Advance Materials, 15, 146-149, 2003).*
Steckler et al. (Chem. Commun., 2007, 4904-4906).*
Gorkem et al. (Adv., Mater. 2008, 20,691-695).*
Ellinger et al. (Nature Materials 7, 2008, 796-799).*
Balan et al. (Chem. Mater. 2008, 20, 7510-7513).*
Ellinger et al. (Adv., Mater. 2008, 20,2772-2776).*
Beaujuge, P. et al., "Unsaturated Linkages in Dioxythiophene-Benzothiadiazole Donor-Acceptor Electrochromic Polymers: The Key Role of Conformational Freedom," *Macromolecules*, 2009, pp. 3694-3706, vol. 42, No. 11.
Brookins, R.N. et al., "Base-Free Suzuki Polymerization for the Synthesis of Polyfluorenes Functionalized with Carboxylic Acids," *Macromolecules*, 2007, pp. 3524-3526, vol. 40.
Galand, E.M. et al., "Optimization of Narrow Band-Gap Propylenedioxythiophene:Cyanovinylene Copolymers for Optoelectronic Applications," *Macromolecules*, 2006, pp. 9132-9142, vol. 39, No. 26.

(Continued)

*Primary Examiner* — Shane Fang
(74) *Attorney, Agent, or Firm* — Saliwanchik, Lloyd & Eisenschenk

(57) ABSTRACT

Embodiments of the invention are directed to alternating donor-acceptor (DA) polymers that are soluble and display a blue or green neutral state that oxidizes to a transmissive state for use as an electrochromic polymer. The D units have 3,4-dioxythiophene, 3,6-dialkoxythieno[3,2-b]thiophene or 3,5-dialkoxy-dithieno[3,2-b:2',3'-d]thiophene groups. Embodiments of the invention are directed to a method for preparation of the alternating DA polymeric sequences of the DA polymers by a cross-condensation of a nucleophilic acceptor monomer and an electrophilic donor monomer.

16 Claims, 14 Drawing Sheets

OTHER PUBLICATIONS

Havinga, E.E. et al., "Alternate Donor-Acceptor Small-Band-Gap Semiconducting Polymers; Polysquaraines and Polycroconaines," *Synthetic Metals*, 1993, pp. 299-306, vol. 55-57.

Thompson, B.C. et al., Soluble Narrow Band Gap and Blue Propylenedioxythiophene-Cyanovinylene Polymers as Multifunctional Materials for Photovoltaic and Electrochromic Applications, *J. Am. Chem. Soc.*, 2006, pp. 12714-12725, vol. 128, No. 39.

Tsao, H.N. et al., "The Influence of Morphology on High-Performance Polymer Field-Effect Transistors," *Advanced Materials*, 2009, pp. 209-212, vol. 21.

Zhang, M. et al., "Field-Effect Transistors Based on a Benzothiadiazole-Cyclopentadithiophene Copolymer," *J. Am. Chem. Soc.*, 2007, pp. 3472-3473, vol. 129.

\* cited by examiner

SOLUBLE ALTERNATING DONOR-ACCEPTOR CONJUGATED POLYMER ELECTROCHROMES

CROSS-REFERENCE TO RELATED APPLICATION

The present application claims the benefit of U.S. Provisional Application Ser. No. 61/222,653, filed Jul. 2, 2009, which is hereby incorporated by reference herein in its entirety, including any figures, tables, or drawings.

The subject invention was made with government support under a research project supported by Air Force Office of Scientific Research, Contract No. UF Project 59866. The government has certain rights to this invention.

BACKGROUND OF INVENTION

Polymeric electrochromics capable of a fast and reversible color change upon electrochemical oxidation and reduction have received considerable attention over the past two decades. A particular emphasis has been placed on incorporating the most stable of these electrochromic polymers (ECPs) in devices such as windows, mirrors (rear-view/side-view mirrors for cars) and displays, and other devices. Recently, synthetic conducting donor-acceptor (DA) polymers were demonstrated to have good performance as electrochromic polymers (ECPs).

The donor-acceptor approach, first reported for macromolecular systems by Having a et al., *Synth. Met.* 1993, 55, 299, allows the tuning of ultraviolet, visible, and near-infrared absorption bands in conjugated polymers (CPs) by the alternation of electron-rich donor (D) and electron-poor acceptor (A) segments. In these DA-polymers, the acceptors are easier to reduce, while the donors are easier to oxidize. The acceptor unit has a less negative reduction potential, as measured by cyclic voltammetry for the units hydrogen terminated monomeric species, than that for the equivalent hydrogen terminated donor unit. This approach has been used to tune the optical and electronic properties of CPs for applications such as field-effect transistors, light emitting diodes, and photovoltaics. To these ends, much effort has been directed to ECPs that are red, blue and green, the complimentary set of colors in the additive primary color space. Although ECPs of all of these colors have been prepared, they generally lack in optical contrast, switching speed, stability, processability or scalability of fabrication.

With respect to fabrication, the common synthetic approach to DA polymers has been through transition metal cross-coupling methods. In these methods, an electrophile, for example, an aryl halide, and a nucleophile, for example, an aryl-magnesium, are coupled, generally in the presence of a transition metal catalyst, for example, a nickel catalyst. In nearly all examples, as seems logically intuitive, the electron rich donor monomer is employed as the nucleophile as they are easily metallated and are highly reactive with electrophiles, whereas the acceptor units, for example, electron-deficient aryl halides, are used as the complementary electrophiles. Generally the weak carbon-halogen bonds are easily broken in the presence of the metal catalyst. Although DA polymers have resulted from such synthesis, those which have overcome all of the other barriers to implementation as ECPs in devices still lack for some colors, for example blue ECPs. Presently, only one DA polymer has been synthesized by cross coupling where the nucleophile is the acceptor, and the electrophile is the donor. (see Zhang et al., *J. Am. Chem. Soc.* 2007, 129, 3472 and Tsao et al., *Adv. Mater.*, 2009, 21, 209) The alternating copolymer has benzothiadiazole (BTD) and 4,4-dihexadecylcyclopentadithiophene (CDT) repeating units and has been prepared by an "inverted" phase-transfer base-catalyzed Suzuki synthesis in a yield of 42 percent, which is not encouraging for commercial development of the polymer. This BTD-CDT DA polymer displays properties appropriate for organic field-effect transistors (OFETs) but its electrochromic properties have not been reported, and its neutral state absorption spectra is not attractive for development as an ECP.

BRIEF SUMMARY

Embodiments of the invention are directed to alternating donor-acceptor (DA) polymers having a plurality of donor units that are 3,4-alkylenedioxythiophenes substituted on the alkylene bridge, 3,4-dialkoxythiophenes, 3,6-dialkoxythieno[3,2-b]thiophenes, 3,5-dialkoxy-dithieno[3,2-b:2',3'-d]thiophene 4,4'-dialkoxy-oligothiophenes or any combination thereof and a plurality of acceptor units that are electron-poor aromatic units or cyanovinylene units alternating with the donor units in one or more polymeric sequence of 4 to 200,000 units. The novel DA polymers display a blue or green color in a neutral state and are transmissive in an oxidized state. The DA polymers are soluble in at least one solvent. The DA polymer can be homopolymers or the one or more polymeric sequences can be one or more portions of a block copolymer, graft copolymer, polymer network or super-molecular structure. The DA polymer sequence in the neutral state exhibits a window of transmission in the range 320-560 nm with a maximum transmission at 400 to 500 nm depending on the specific D and A units combined in the sequence. Light absorbance measured at maxima in visible bands adjacent to the window of transmission observed for the neutral state DA polymer are at least 20% greater than that observed for the fully oxidized state DA polymer at the wavelengths of the neutral state maxima.

Appropriate 3,4-alkylenedioxythiophene units have the structure:

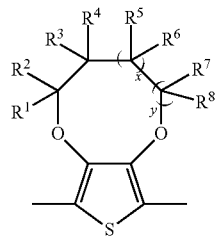

where x is 0 or 1, y is 0 or 1, and $R^1$, $R^2$, $R^3$, $R^4$, $R^5$, $R^6$, $R^7$ and $R^8$ are independently H, $C_1$-$C_{30}$ alkyl, $C_2$-$C_{30}$ alkenyl, $C_2$-$C_{30}$ alkynyl, $C_6$-$C_{14}$ aryl, $C_7$-$C_{30}$ arylalkyl, $C_8$-$C_{30}$ arylalkenyl, $C_8$-$C_{30}$ arylalkynyl, hydroxy, $C_1$-$C_{30}$ alkoxy, $C_6$-$C_{14}$ aryloxy, $C_7$-$C_{30}$ arylalkyloxy, $C_2$-$C_{30}$ alkenyloxy, $C_2$-$C_{30}$ alkynyloxy, $C_8$-$C_{30}$ arylalkenyloxy, $C_8$-$C_{30}$ arylalkynyloxy, $CO_2H$, $C_2$-$C_{30}$ alkylester, $C_7$-$C_{15}$ arylester, $C_8$-$C_{30}$ alkylarylester, $C_3$-$C_{30}$ alkenylester, $C_3$-$C_{30}$ alkynylester, $NH_2$, $C_1$-$C_{30}$ alkylamino, $C_6$-$C_{14}$ arylamino, $C_7$-$C_{30}$ (arylalkyl)amino, $C_2$-$C_{30}$ alkenylamino, $C_2$-$C_{30}$ alkynylamino, $C_8$-$C_{30}$ (arylalkenyl)amino, $C_8$-$C_{30}$ (arylalkynyl)amino, $C_2$-$C_{30}$ dialkylamino, $C_{12}$-$C_{28}$ diarylamino, $C_4$-$C_{30}$ dialkenylamino, $C_4$-$C_{30}$ dialkynylamino, $C_7$-$C_{30}$ aryl(alkyl)amino, $C_7$-$C_{30}$ di(arylalkyl)amino, $C_8$-$C_{30}$ alkyl(arylalkyl)amino, $C_{15}$-$C_{30}$ aryl(arylalkyl)amino, $C_8$-$C_{30}$ alkenyl(aryl)amino, $C_8$-$C_{30}$ alkynyl(aryl)

amino $C(O)NH_2$ (amido), $C_2$-$C_{30}$ alkylamido, $C_7$-$C_{14}$ arylamido, $C_8$-$C_{30}$ (arylalkyl)amido, $C_2$-$C_{30}$ dialkylamido, $C_{12}$-$C_{28}$ diarylamido, $C_8$-$C_{30}$ aryl(alkyl)amido, $C_{15}$-$C_{30}$ di(arylalkyl)amido, $C_9$-$C_{30}$ alkyl(arylalkyl)amido, $C_{16}$-$C_{30}$ aryl(arylalkyl)amido, thiol, $C_1$-$C_{30}$ alkylhydroxy, $C_6$-$C_{14}$ arylhydroxy, $C_7$-$C_{30}$ arylalkylhydroxy, $C_3$-$C_{30}$ alkenylhydroxy, $C_3$-$C_{30}$ alkynylhydroxy, $C_8$-$C_{30}$ arylalkenylhydroxy, $C_8$-$C_{30}$ arylalkynylhydroxy, $C_3$-$C_{30}$ polyether, $C_3$-$C_{30}$ polyetherester, $C_3$-$C_{30}$ polyester $C_3$-$C_{30}$ polyamino, $C_3$-$C_{30}$ polyaminoamido, $C_3$-$C_{30}$ polyaminoether, $C_3$-$C_{30}$ polyaminoester, or $C_3$-$C_{30}$ polyamidoester.

Appropriate 3,4-dialkoxythiophene units comprise:

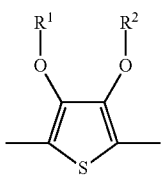

where $R^1$ and $R^2$ are independently H, $C_1$-$C_{30}$ alkyl, $C_2$-$C_{30}$ alkenyl, $C_2$-$C_{30}$ alkynyl, $C_6$-$C_{14}$ aryl, $C_7$-$C_{30}$ arylalkyl, $C_8$-$C_{30}$ arylalkenyl, $C_8$-$C_{30}$ arylalkynyl, $C_2$-$C_{30}$ alkylester, $C_7$-$C_{15}$ arylester, $C_8$-$C_{30}$ alkylarylester, $C_3$-$C_{30}$ alkenylester, $C_3$-$C_{30}$ alkynylester $NH_2$, $C_1$-$C_{30}$ alkylamino, $C_6$-$C_{14}$ arylamino, $C_7$-$C_{30}$ (arylalkyl)amino, $C_2$-$C_{30}$ alkenylamino, $C_2$-$C_{30}$ alkynylamino, $C_8$-$C_{30}$ (arylalkenyl)amino, $C_8$-$C_{30}$ (arylalkynyl)amino, $C_2$-$C_{30}$ dialkylamino, $C_{12}$-$C_{28}$ diarylamino, $C_4$-$C_{30}$ dialkenylamino, $C_4$-$C_{30}$ dialkynylamino, $C_7$-$C_{30}$ aryl(alkyl)amino, $C_7$-$C_{30}$ di(arylalkyl)amino, $C_8$-$C_{30}$ alkyl(arylalkyl)amino, $C_{15}$-$C_{30}$ aryl(arylalkyl)amino, $C_8$-$C_{30}$ alkenyl(aryl)amino, $C_8$-$C_{30}$ alkynyl(aryl)amino $C(O)NH_2$ (amido), $C_2$-$C_{30}$ alkylamido, $C_7$-$C_{14}$ arylamido, $C_8$-$C_{30}$ (arylalkyl)amido, $C_2$-$C_{30}$ dialkylamido, $C_{12}$-$C_{28}$ diarylamido, $C_8$-$C_{30}$ aryl(alkyl)amido, $C_{15}$-$C_{30}$ di(arylalkyl)amido, $C_9$-$C_{30}$ alkyl(arylalkyl)amido, $C_{16}$-$C_{30}$ aryl(arylalkyl)amido, thiol, $C_1$-$C_{30}$ alkylhydroxy, $C_6$-$C_{14}$ arylhydroxy, $C_7$-$C_{30}$ arylalkylhydroxy, $C_3$-$C_{30}$ alkenylhydroxy, $C_3$-$C_{30}$ alkynylhydroxy, $C_8$-$C_{30}$ arylalkenylhydroxy, $C_8$-$C_{30}$ arylalkynylhydroxy, $C_3$-$C_{30}$ polyether, $C_3$-$C_{30}$ polyetherester, $C_3$-$C_{30}$ polyester $C_3$-$C_{30}$ polyamino, $C_3$-$C_{30}$ polyaminoamido, $C_3$-$C_{30}$ polyaminoether, $C_3$-$C_{30}$ polyaminoester, or $C_3$-$C_{30}$ polyamidoester.

Appropriate 3,6-dialkoxythieno[3,2-b]thiophene and 3,5-dialkoxy-dithieno[3,2-b:2',3'-d]thiophene units have the structures:

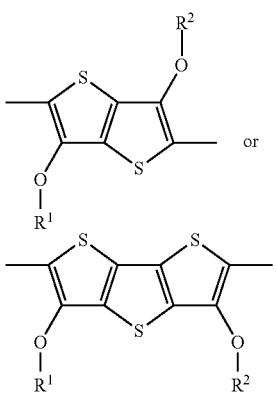

where $R^1$ and $R^2$ are independently H, $C_1$-$C_{30}$ alkyl, $C_2$-$C_{30}$ alkenyl, $C_2$-$C_{30}$ alkynyl, $C_6$-$C_{14}$ aryl, $C_7$-$C_{30}$ arylalkyl, $C_8$-$C_{30}$ arylalkenyl, $C_8$-$C_{30}$ arylalkynyl, $C_2$-$C_{30}$ alkylester, $C_7$-$C_{15}$ arylester, $C_8$-$C_{30}$ alkylarylester, $C_3$-$C_{30}$ alkenylester, $C_3$-$C_{30}$ alkynylester $NH_2$, $C_1$-$C_{30}$ alkylamino, $C_6$-$C_{14}$ arylamino, $C_7$-$C_{30}$ (arylalkyl)amino, $C_2$-$C_{30}$ alkenylamino, $C_2$-$C_{30}$ alkynylamino, $C_8$-$C_{30}$ (arylalkenyl)amino, $C_8$-$C_{30}$ (arylalkynyl)amino, $C_2$-$C_{30}$ dialkylamino, $C_{12}$-$C_{28}$ diarylamino, $C_4$-$C_{30}$ dialkenylamino, $C_4$-$C_{30}$ dialkynylamino, $C_7$-$C_{30}$ aryl(alkyl)amino, $C_7$-$C_{30}$ di(arylalkyl)amino, $C_8$-$C_{30}$ alkyl(arylalkyl)amino, $C_{15}$-$C_{30}$ aryl(arylalkyl)amino, $C_8$-$C_{30}$ alkenyl(aryl)amino, $C_8$-$C_{30}$ alkenyl(aryl)amino $C(O)NH_2$ (amido), $C_2$-$C_{30}$ alkylamido, $C_7$-$C_{14}$ arylamido, $C_8$-$C_{30}$ (arylalkyl)amido, $C_2$-$C_{30}$ dialkylamido, $C_{12}$-$C_{28}$ diarylamido, $C_8$-$C_{30}$ aryl(alkyl)amido, $C_{15}$-$C_{30}$ di(arylalkyl)amido, $C_9$-$C_{30}$ alkyl(arylalkyl)amido, $C_{16}$-$C_{30}$ aryl(arylalkyl)amido, thiol, $C_1$-$C_{30}$ alkhydroxy, $C_6$-$C_{14}$ arylhydroxy, $C_7$-$C_{30}$ arylalkylhydroxy, $C_3$-$C_{30}$ alkenylhydroxy, $C_3$-$C_{30}$ alkynylhydroxy, $C_8$-$C_{30}$ arylalkenylhydroxy, $C_8$-$C_{30}$ arylalkynylhydroxy, $C_3$-$C_{30}$ polyether, $C_3$-$C_{30}$ polyetherester, $C_3$-$C_{30}$ polyester $C_3$-$C_{30}$ polyamino, $C_3$-$C_{30}$ polyaminoamido, $C_3$-$C_{30}$ polyaminoether, $C_3$-$C_{30}$ polyaminoester, or $C_3$-$C_{30}$ polyamidoester.

Appropriate electron-poor aromatic units or cyanovinylene units that are the acceptor units of the DA polymers include, but are not limited to, benzo[c][1,2,5]thiadiazole, benzo[c][1,2,5]oxadiazole, quinoxaline, benzo[d][1,2,3]triazole, pyrido[3,4-b]pyrazine, cyanovinylene, thiazolo[5,4-d]thiazole, 1,3,4-thiadiazole, pyrrolo[3,4-c]pyrrole-1,4-dione, 2,2'-bithiazole, [1,2,5]thiadiazolo[3,4-c]pyridine, thieno[3,4-b]pyrazine, [1,2,5]oxadiazolo[3,4-c]pyridine, dicyanovinylene, benzo[1,2-c;4,5-c']bis[1,2,5]thiadiazole, [1,2,5]thiadiazolo[3,4-g]quinoxaline, 4-dicyanomethylenecyclopentadithiolene, benzo[c]thiophene or any derivative thereof.

Other embodiments of the invention are directed to a method for preparation of the above DA polymers where a plurality of one or more nucleophilic aromatic monomeric acceptor units that are disubstituted with groups including tin, boron, zinc, silicon, or magnesium atoms and a plurality of one or more electrophilic monomeric donor units that include a 3,4-substituted dioxythiophene or 4,4'-substituted dioxy-oligothiophene and a pair of leaving groups are combined in one or more solvents with a catalyst, if needed, to cross-couple the monomeric donor units with the monomeric acceptor units to yield the DA polymer with alternating donor and acceptor units. Alternately, a plurality of one or more nucleophilic aromatic monomeric acceptor units that have a pair of leaving groups are combined with a plurality of one or more electrophilic monomeric donor units that include a 3,4-substituted dioxythiophene or 4,4'-substituted dioxy-oligothiophene that are disubstituted with groups including tin, boron, zinc, silicon, or magnesium atoms are combined. The monomeric acceptor units are the acceptor units given above that are appropriately substituted with a pair of leaving groups that can be halogens, triflates, tosylates, nosylates, trifluoroacetates, mesylates or any appropriate sulfonate leaving group. Halogens can be bromides, chlorides or iodides. An appropriate catalyst can be a palladium-comprising compound, which is beneficial for catalyzing an inverse Suzuki condensation. As needed the inverse Suzuki condensation can be carried out in the absence of added base. The condensation can be a Stille coupling, Kumada coupling, Hiyama coupling, Negishi coupling or inverse Suzuki coupling.

blue or b) green to transmissive electrochromic polymers according to embodiments of the invention.

Figure 2:
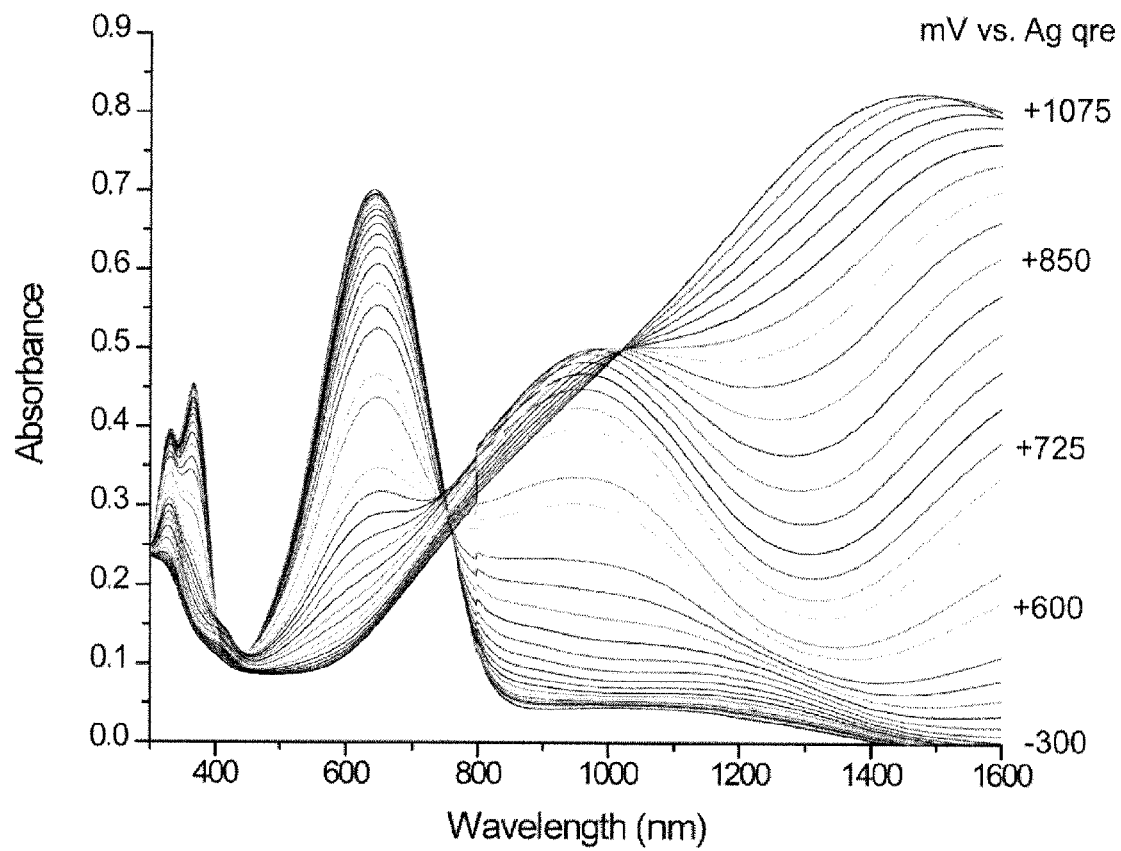

FIG. 2 shows a spectroelectrochemistry plot for P1 where R is octyloxy, as indicated in Scheme 2, in accordance with an embodiment of the subject invention where P1 was spray-cast onto ITO-coated glass from a toluene solution (1 mg mL$^{-1}$) where electrochemical oxidation of the films was carried out in 0.1 M LiBF$_4$/PC supporting electrolyte using a silver wire as a quasi-reference electrode (calibrated against Fc/Fc$^+$) and a platinum wire as the counter electrode, with the applied potential increased in 25 mV steps from 0 V to 0.95 V vs. Fc/Fc$^+$.

Figure 3:
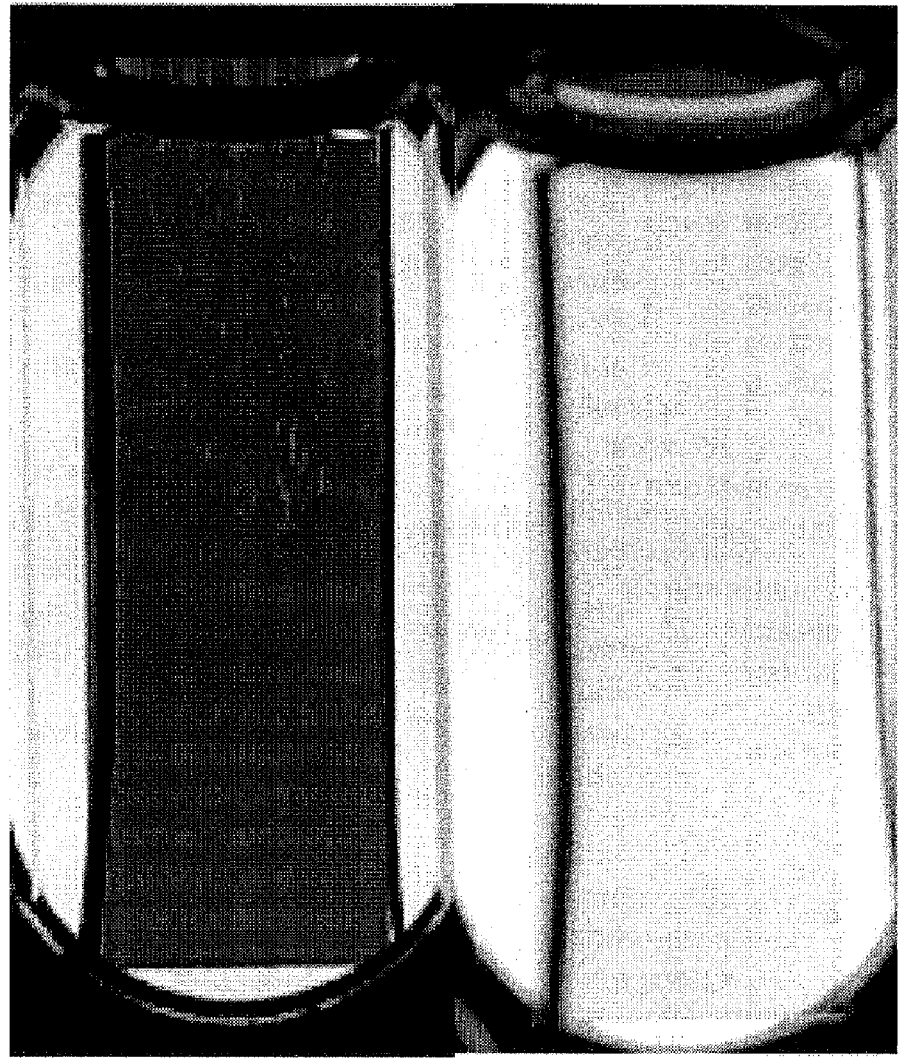

FIG. 3 shows photographic images for neutral and fully oxidized P1 where R is octyloxy, as indicated in Scheme 2, in accordance with an embodiment of the invention.

Figure 4:
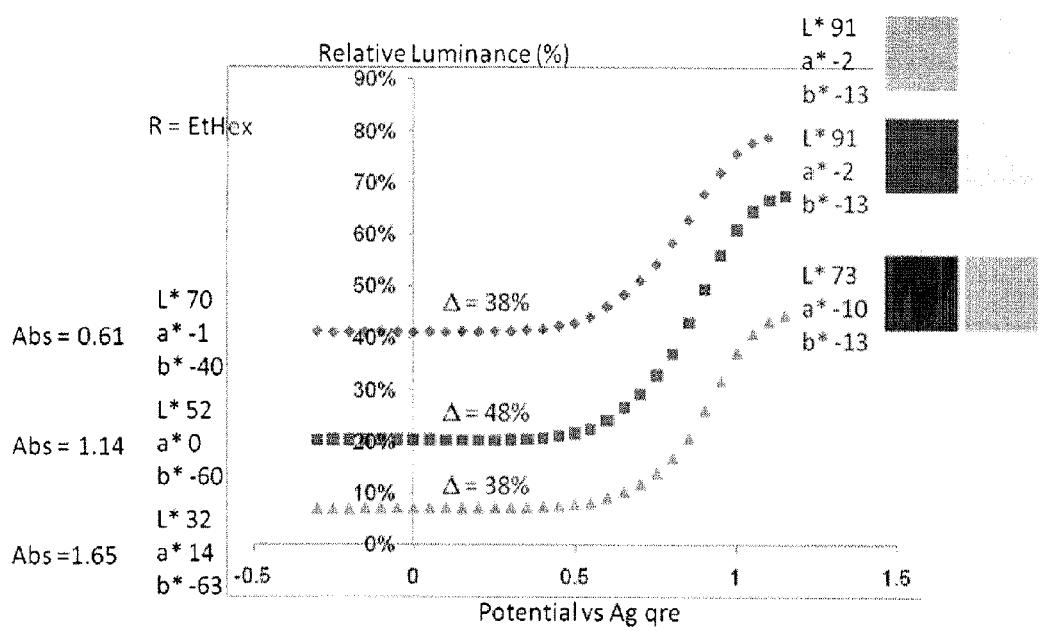

FIG. 4 shows a relative luminance as a function of applied potential for different thicknesses of spray-coated P2, as indicated in Scheme 2, with absorbance at $\lambda_{max}$ indicated to the left of each trace and is proportional to the thickness of the films in accordance with an embodiment of the invention. The colored squares are representations of the measured CIE L*a*b* values in fully neutral and oxidized states.

Figure 5:
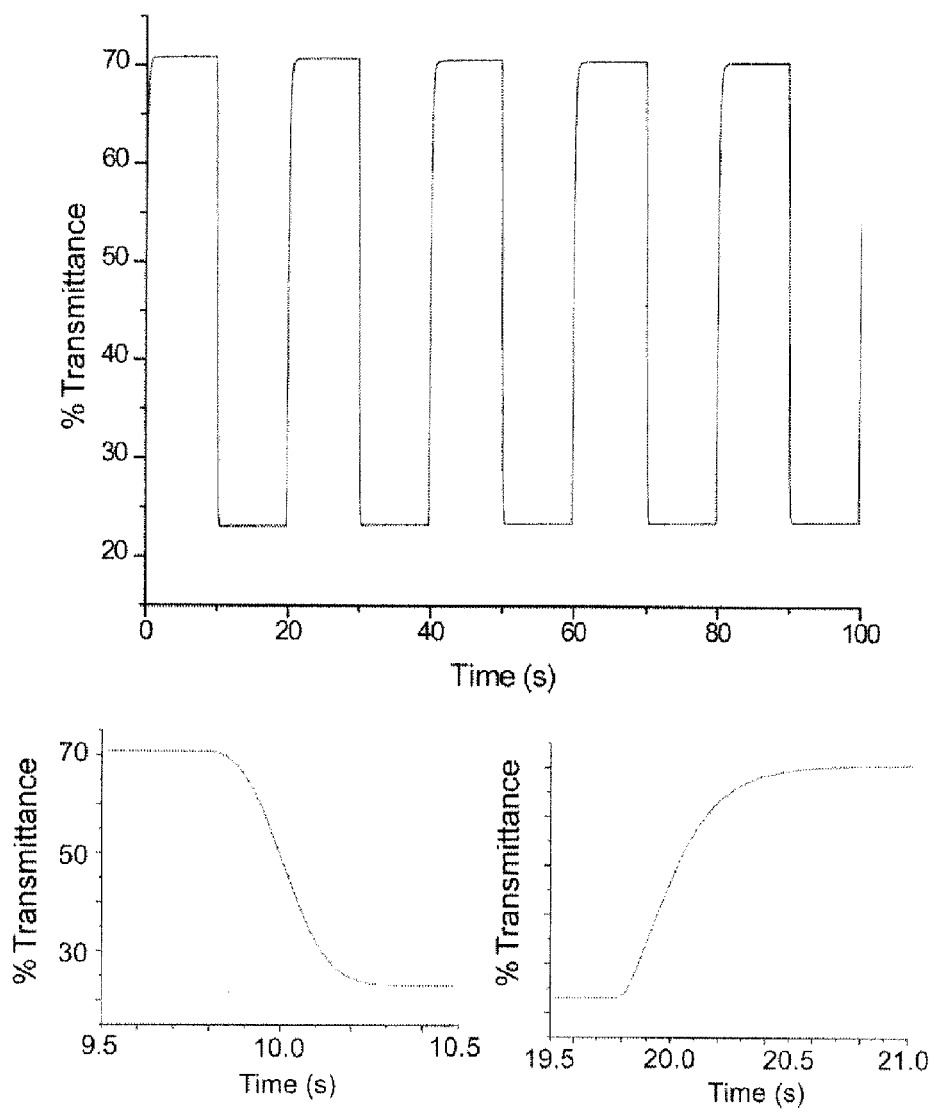

FIG. 5 is a plot of the change in transmittance at 640 nm of P1, as indicated in Scheme 2, as a function of time using potential square waves of 10 seconds at −0.4 V, then 10 seconds at 0.95 V vs. Ag QRE (quasi-reference electrode) to induce switching according to an embodiment of the invention.

Figure 6:
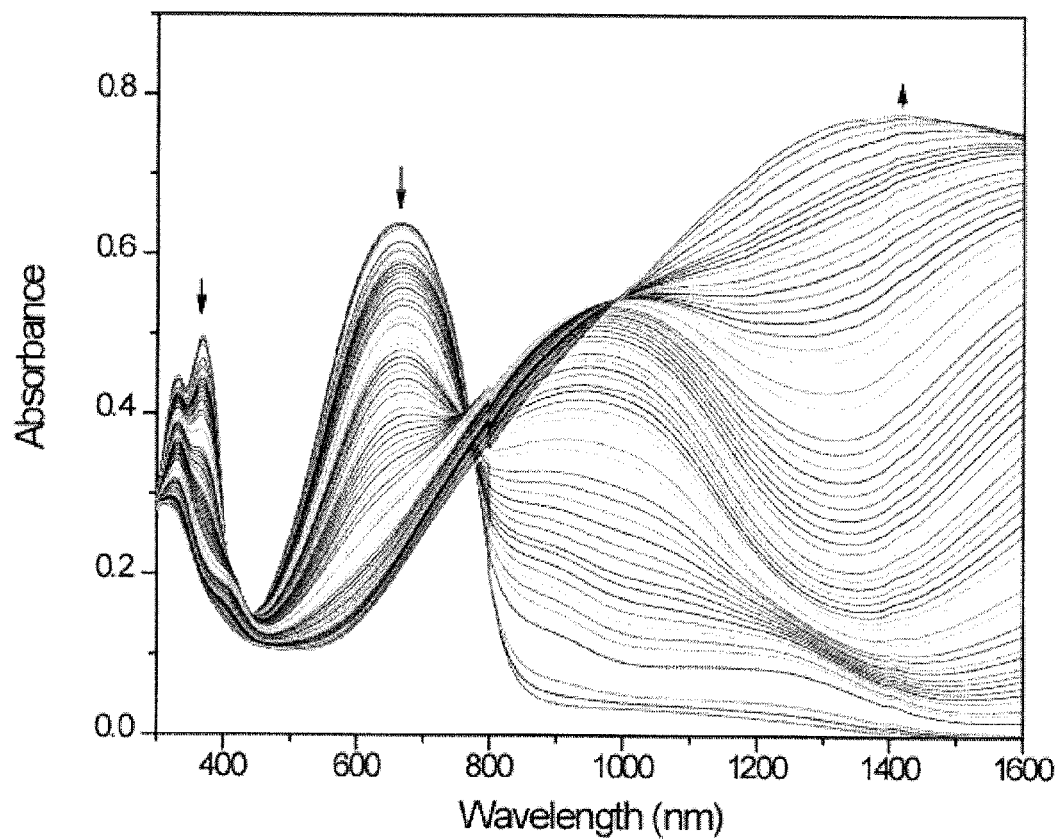

FIG. 6 shows a spectroelectrochemistry plot of P2, as indicated in Scheme 2, in accordance with an embodiment of the invention for a film spray-cast onto ITO-coated glass from a toluene solution (1 mg mL$^{-1}$) where electrochemical oxidation of the films was carried out in 0.1 M LiBF$_4$/PC supporting electrolyte using a silver wire as a quasi-reference electrode (calibrated against Fc/Fc$^+$) and a platinum wire as the counter electrode with applied potentials increased in 15 mV steps from 0 V to 0.95 V vs. Fe/Fc$^+$.

Figure 7:
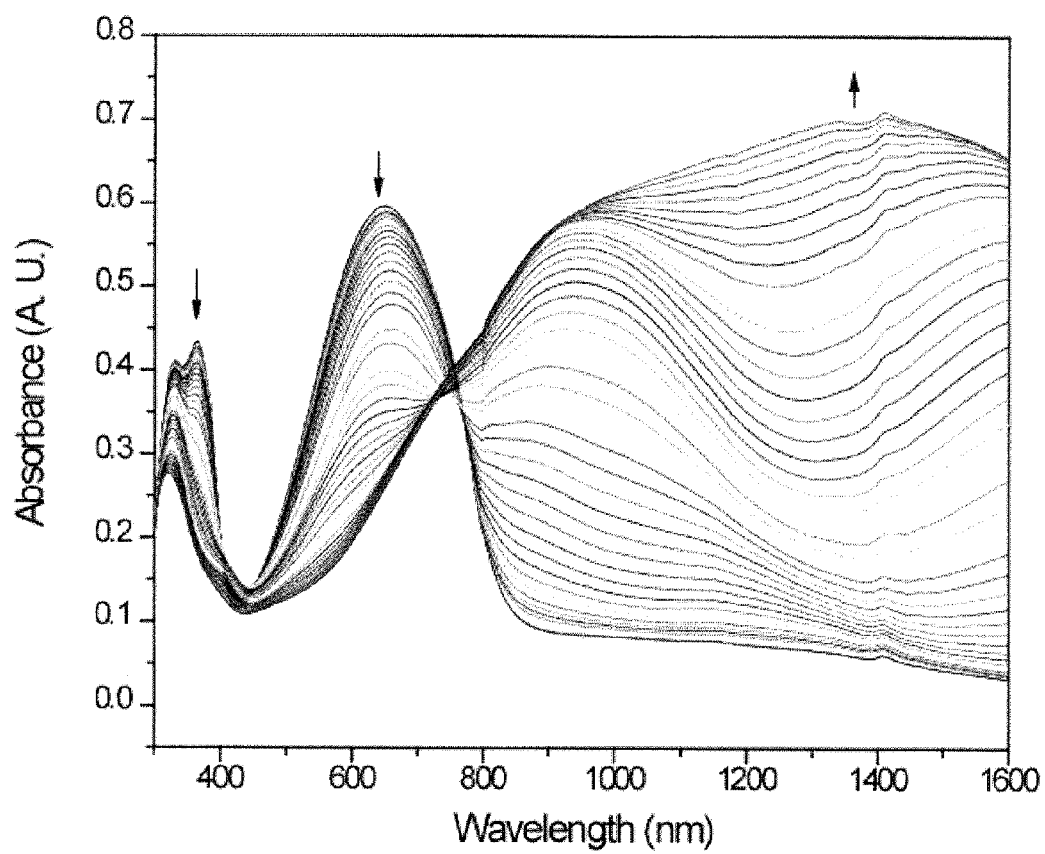

FIG. 7 shows a spectroelectrochemistry plot of P3, as indicated in Scheme 2, in accordance with an embodiment of the invention for a film spray-cast onto ITO-coated glass from a toluene solution (1 mg mL$^{-1}$), where electrochemical oxidation of the films was carried out in 0.1 M LiBF$_4$/PC supporting electrolyte using a silver wire as a quasi-reference electrode (calibrated against Fc/Fc$^+$) and a platinum wire as the counter electrode with applied potentials increased in 25 mV steps from 0 V to 0.95 V vs. Fc/Fc$^+$.

Figure 8:
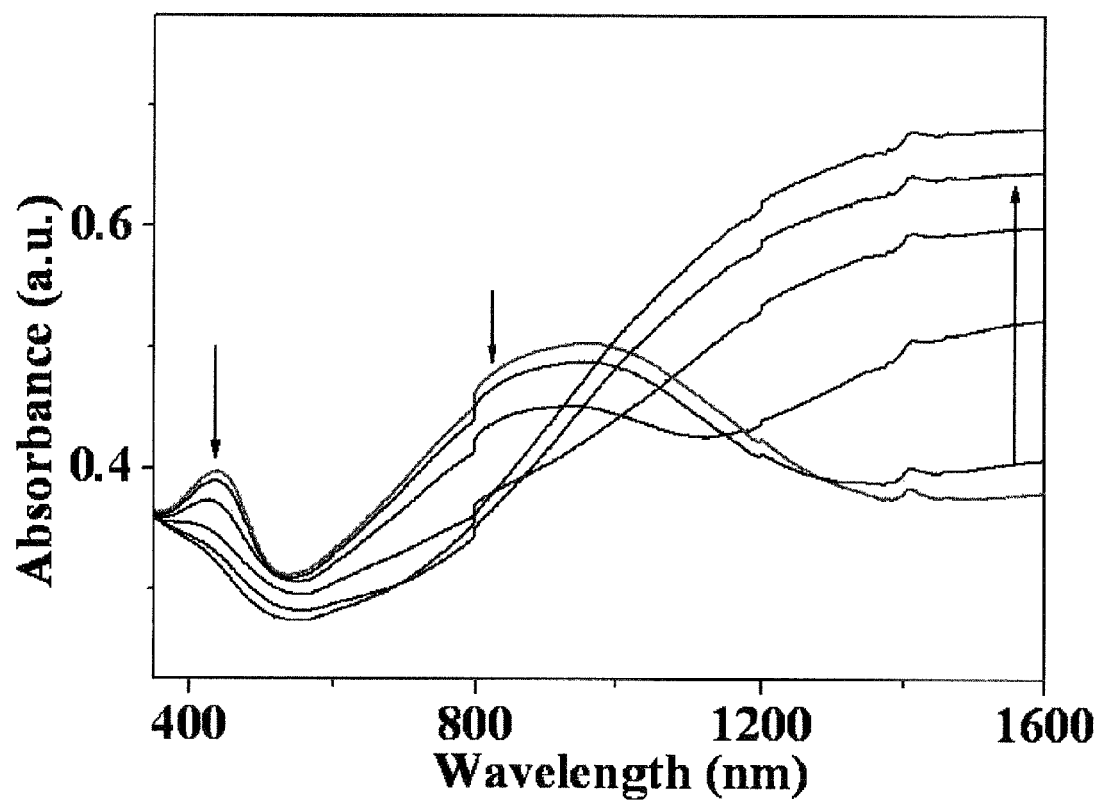

FIG. 8 shows a spectroelectrochemistry plot of P4, as indicated in Scheme 3, in accordance with an embodiment of the invention for a film spray-cast onto ITO-coated glass from a toluene solution (2 mg mL$^{-1}$) where electrochemical oxidation of the films was carried out in 0.1 M LiBTI/PC, supporting electrolyte using a silver wire as a quasi reference electrode, and a platinum wire as the counter electrode with applied potential of −0.48, −0.28, −0.08, 0.12, 0.32 and 0.52 V vs. Fc/Fc$^+$.

Figure 9:
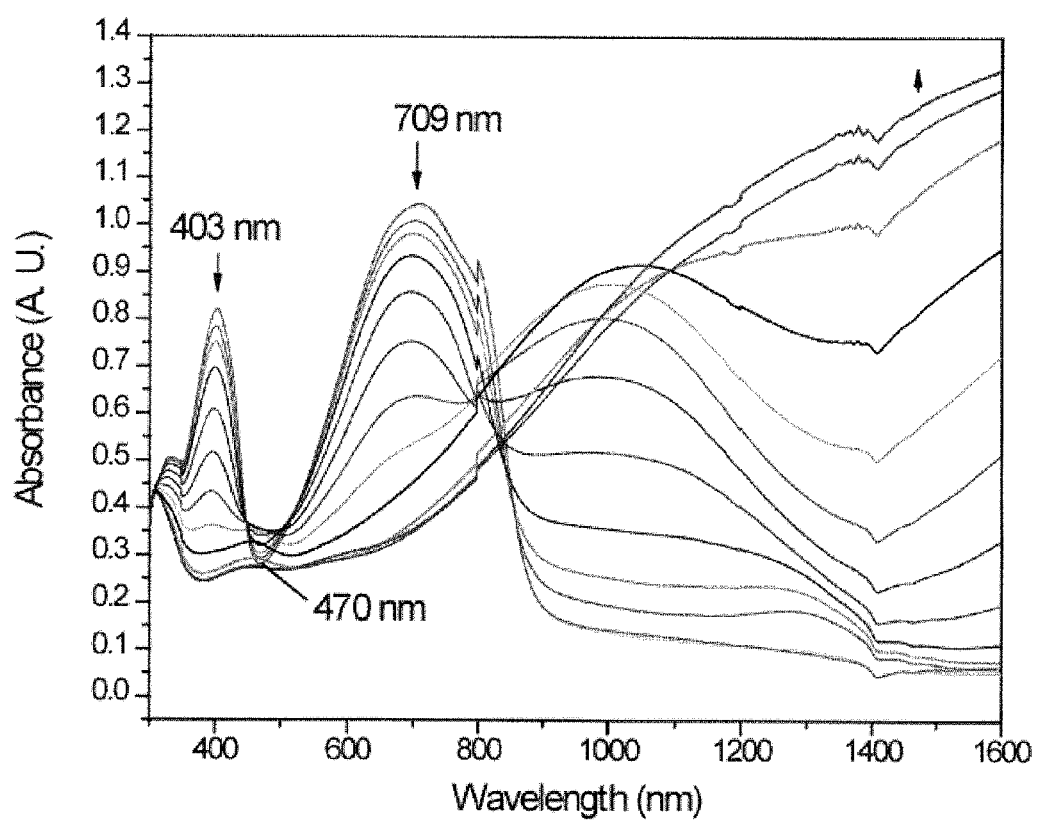

FIG. 9 shows a spectroelectrochemistry plot of P5, as indicated in Scheme 2, in accordance with an embodiment of the invention for a film spray-cast onto ITO-coated glass from a toluene solution (1 mg mL$^{-1}$) where electrochemical oxidation of the films was carried out in 0.2 M LiBTI/PC, supporting electrolyte using a Ag/Ag$^+$ reference electrode, and a platinum wire as the counter electrode where the applied potential was −0.5 (green spectrum), −0.2 (yellow spectrum), and then increased in 100 mV steps from 0 V to 1 V vs. Fc/Fc$^+$.

Figure 10:
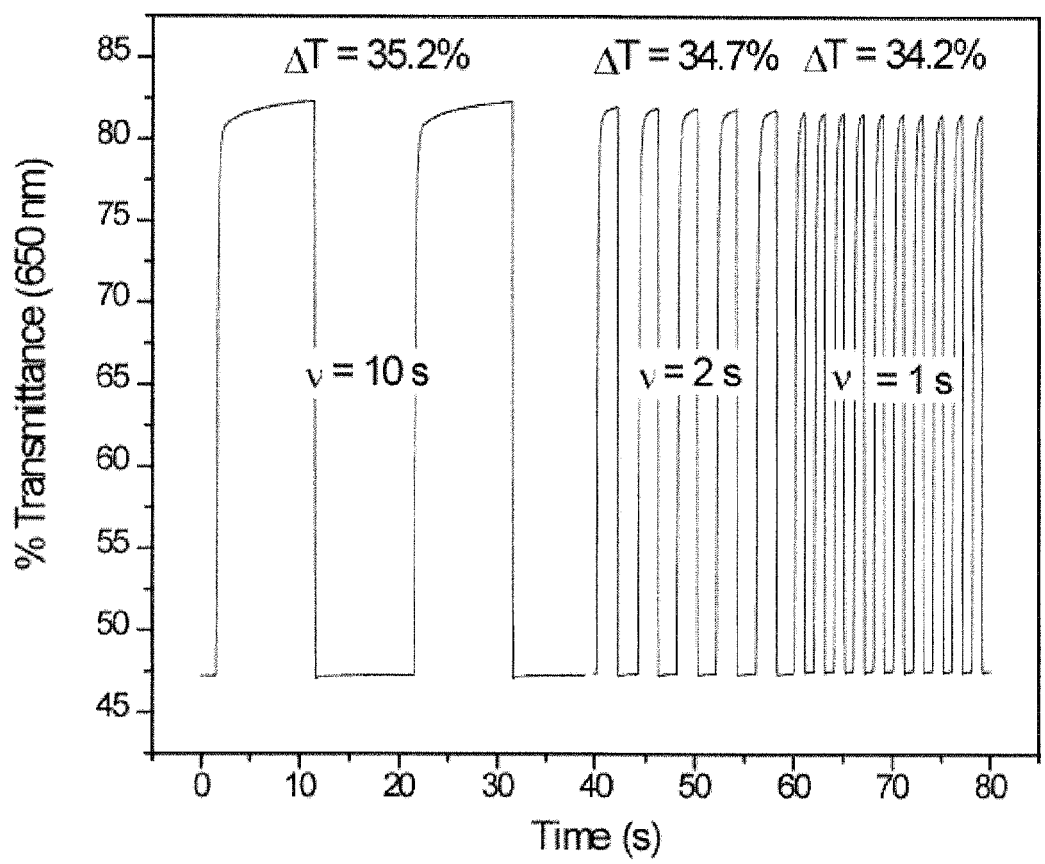

FIG. 10 shows a square wave potential step absoptometry for spray-cast thin films of P2, as indicated in Scheme 2, in accordance with an embodiment of the invention (left, monitored at 645 nm, −0.4→1.06 V vs. Fc/Fc$^+$), in 0.2M Li BTI/PC solution using switch time 10 s step for 40 s (2 cycles), then 2 s step for 20 s (5 cycles), and 1 s step for 20 seconds (10 cycles).

Figure 11:
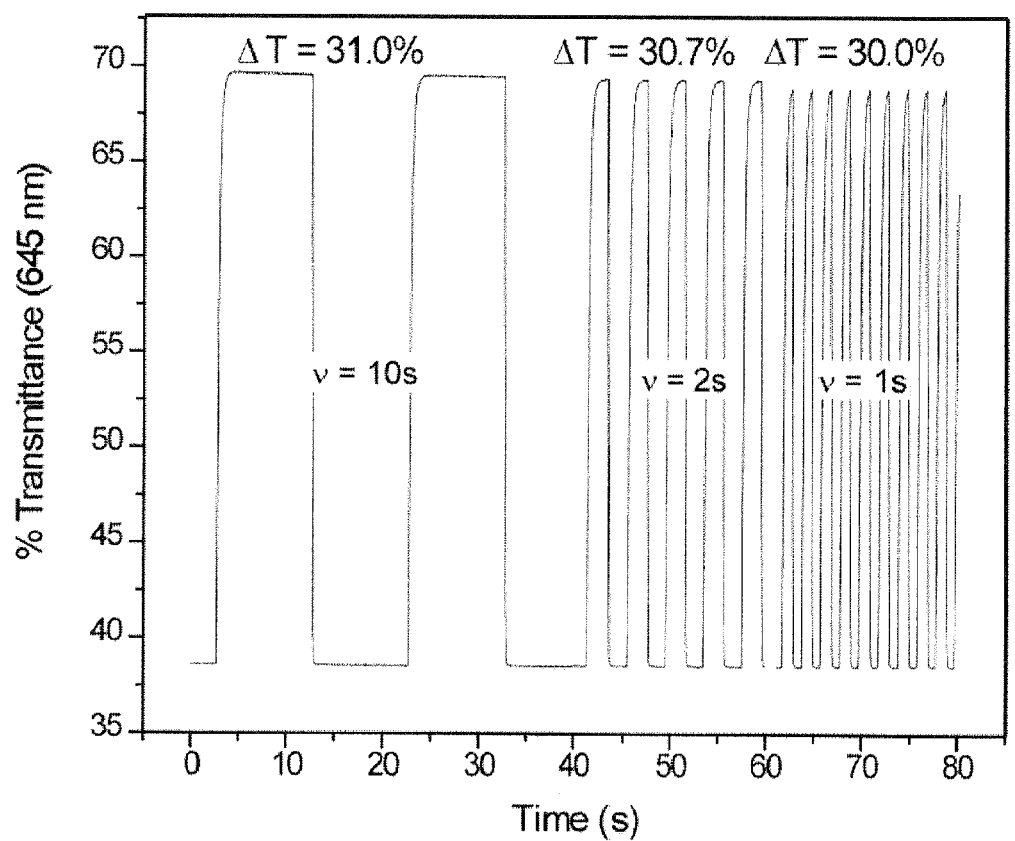

FIG. 11 shows a square wave potential step absoptometry of spray-cast thin films of P3, as indicated in Scheme 2, in accordance with an embodiment of the invention (left, monitored at 645 nm, −0.4→0.96 V vs. Fc/Fc$^+$), in 0.2M Li BTI/PC solution using switch time 10 s step for 40 s (2 cycles), then 2 s step for 20 s (5 cycles), and 1 s step for 20 seconds (10 cycles).

Figure 12:
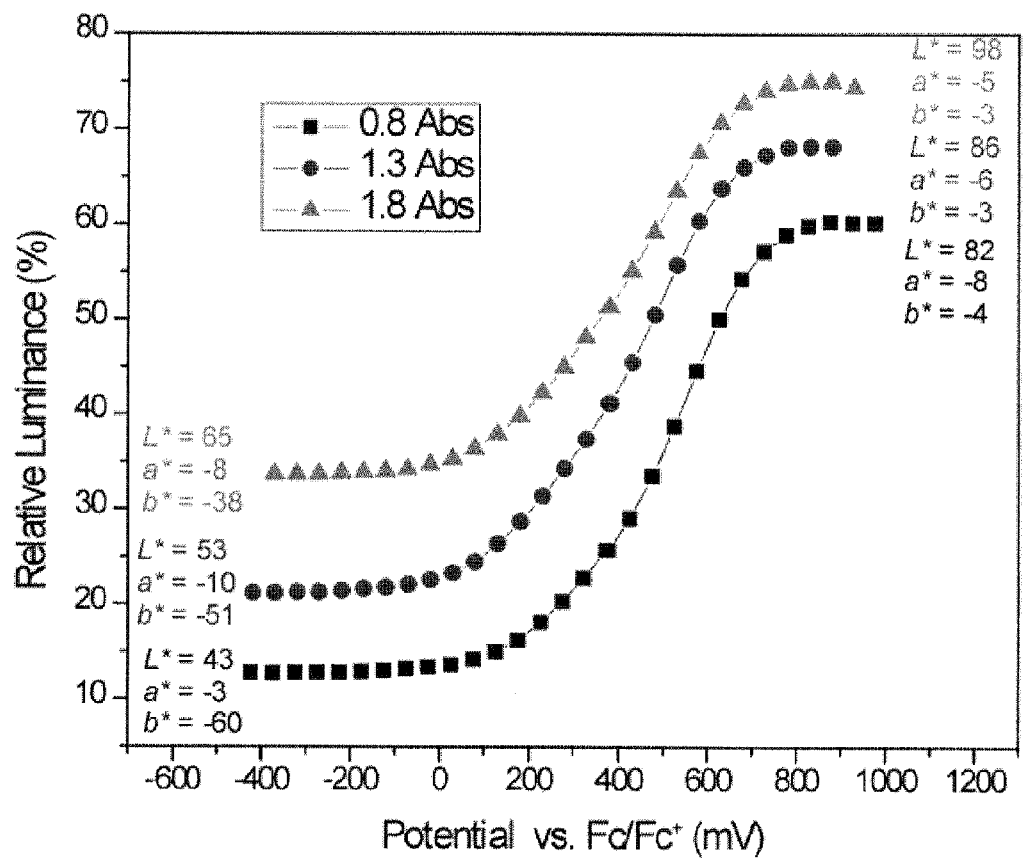

FIG. 12 is a plot of relative luminance (%) as a function of applied potential for spray-coated films of P1, as indicated in Scheme 2, in accordance with an embodiment of the invention, at differing film thicknesses indicated by the absorbance of neutral state at 645 nm with color matching, L*a*b* values (in the sense of the CIE 1976 L*a*b* color model) of fully neutral and oxidized states for the films.

Figure 13:
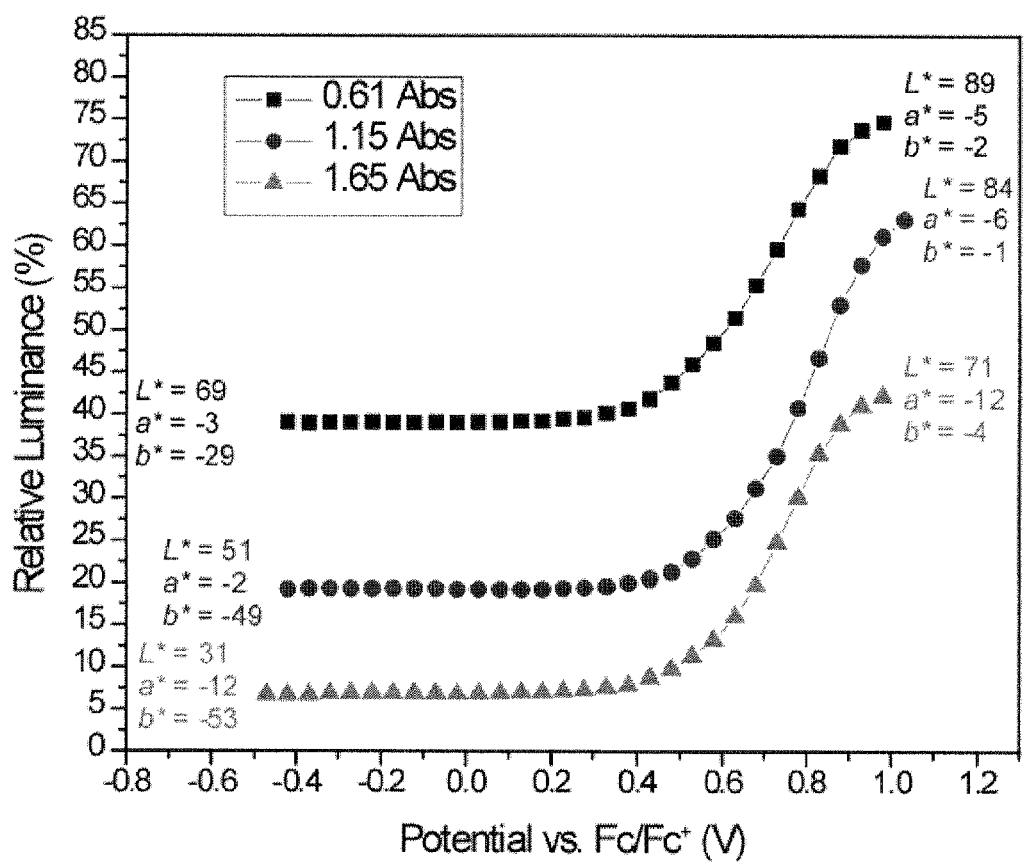

FIG. 13 is a plot of relative luminance (%) as a function of applied potential for spray-coated films of P2, as indicated in Scheme 2, in accordance with an embodiment of the invention, at differing film thicknesses indicated by the absorbance of neutral state at 645 nm with color matching, L*a*b* values (in the sense of the CIE 1976 L*a*b* color model) of fully neutral and oxidized states for the films.

Figure 14:
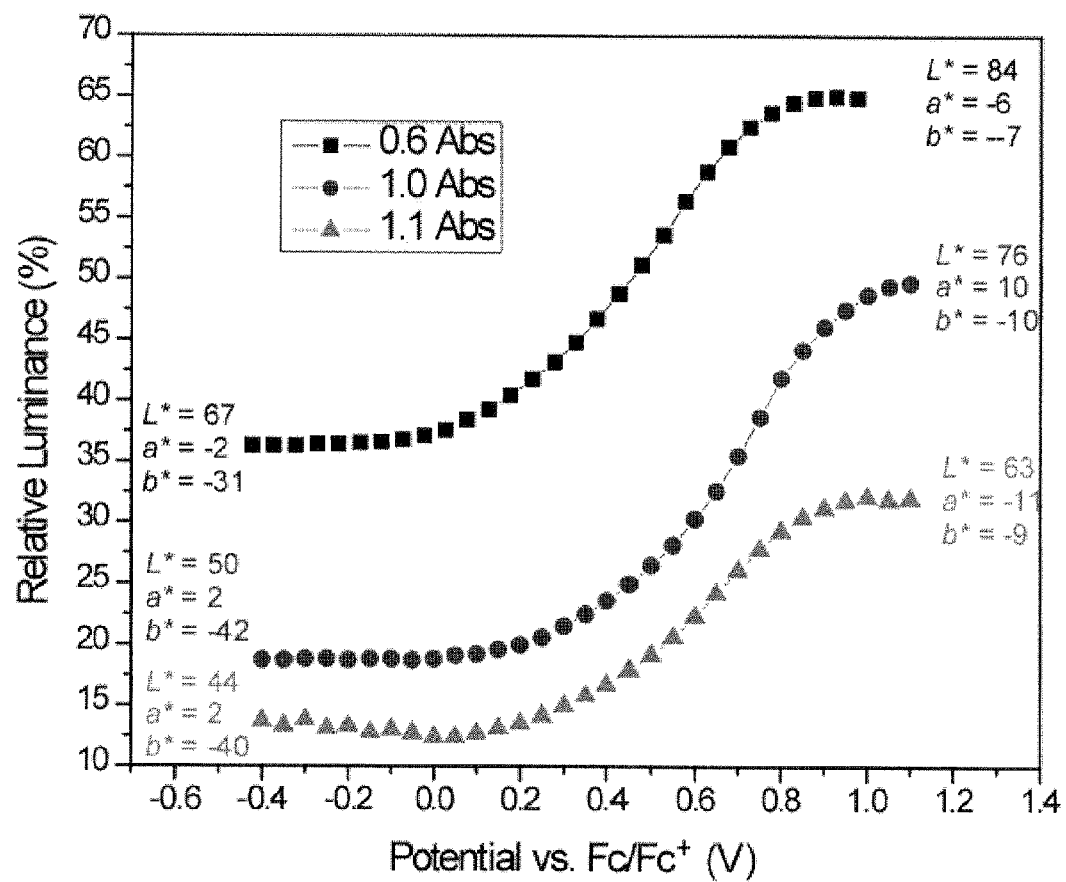

FIG. 14 is a plot of relative luminance (%) as a function of applied potential for spray-coated films of P3, as indicated in Scheme 2, in accordance with an embodiment of the invention, at differing film thicknesses indicated by the absorbance of neutral state at 645 nm with color matching, L*a*b* values (in the sense of the CIE 1976 L*a*b* color model) of fully neutral and oxidized states for the films.

DETAILED DISCLOSURE

Embodiments of the invention are directed to soluble donor-acceptor (DA) polymers that can be easily processed for use in electrochromic devices where the DA polymer is blue or green in the neutral state. The DA polymer has donor units comprising a dioxythiophene group in the form of a 3,4-alkylenedioxythiophene donor unit, a 3,4-dialkoxythiophene donor unit, a 3,6-dialkoxythieno[3,2-b]thiophene donor unit or a 3,5-dialkoxy-dithieno[3,2-b:2',3'-d]thiophene donor unit. In all embodiments of the invention, the D and A units alternate along the entire length of a conjugated chain that comprises a DA polymeric sequence in the DA polymer. In one embodiment of the invention, a 3,4-propylenedioxythiophene (ProDOT) unit is the donor unit and is substituted on the alkylene bridge to impart solubility to the DA polymer in a desired solvent and a benzothiadiazole (BTD) acceptor unit. Although there are many other 3,4-alkylenedioxythiophene, 3,4-dialkoxythiophene, 3,6-dialkoxythieno[3,2-b]thiophene or 3,5-dialkoxy-dithieno[3,2-b:2',3'-d]thiophene units that fulfill the requirements of the donor units, many of the illustrations herein are to a symmetrically substituted ProDOT, and it is to be understood that many other donor monomers can be employed in like manner in other embodiments of the invention.

The solubility of the novel DA polymers allows processing from solution for ready incorporation as a film in an electrochromic device by scalable inexpensive deposition methods, such as spin coating and spray casting. The DA polymer displays a blue-to-transmissive or green-to-transmissive optical change upon oxidation of the neutral polymer. Again, it should be understood that where an embodiment of the invention is given in regard to a blue-to-transmissive DA polymer, other embodiments of the invention that are equivalent in many respects, with the exception of the specific structure of the D and A units therein, are achieved by appropriate selection of desired D and A units, particularly based on the structure of the A unit and the LUMO level of the polymer imparted by that A unit structure. For example, for a given D unit such as a 3,4-alkylenedioxythiophene or 3,4-dialkoxythiophene unit, the neutral state color may be blue where the A unit is a BTD but may be green when a more electron-deficient acceptor unit, such as [1,2,5]thiadiazolo[3,4-c]pyridine, is incorporated into the DA polymer or when BTD is used with an even more electron-rich donor unit that provides a higher HOMO level of the polymer, for example a 3,6-dialkoxythieno[3,2-b]thiophene or a 3,5-dialkoxy-dithieno [3,2-b:2',3'-d]thiophene unit. When the more electron-rich donor unit is coupled with a more electron-deficient acceptor unit, such as [1,2,5]thiadiazolo[3,4-c]pyridine the neutral state DA polymer can be transmissive at higher wavelengths and display a yellow or even orange color.

In some embodiments of the invention, the polymeric sequence of the DA polymer is a segment of a block copolymer, graft copolymer, or polymer network. For example, as can be appreciated from one skilled in the art, a triblock copolymer can be formed where a polymer mono-terminated in a D and/or an A unit can be used in a cross-condensation polymerization with other D and A monomers according to an embodiment of the invention, or where a portion of the polymer terminated D and/or A units are terminated at both ends to form a multiblock polymer, or where all polymer terminated D and/or A units are branched and terminated at a sufficient number of termini of the polymer such that a cross-linked network is formed upon polymerization. The other segments of the DA polymers where the alternating DA polymeric sequence provides the electrochromic properties can be any polymer that can be prepared by a step-growth or chain-growth process and the non-DA segments of the DA polymer can be formed before, during or after the formation of the DA polymeric sequences, as can be appreciated by one skilled in the art. The DA polymer can be transformed into a different DA polymer, by reactions at the DA polymeric sequence, for example, but not limited to, a transformation of the substituents on one or more of the donor units, or by reactions involving one or more units of the other polymeric segments. The attachment of the DA polymeric sequence to other polymeric segments can be from a substituent on the D or A units, or can be from an end unit of a DA polymeric sequence. For example, a D unit and/or an A unit is terminal and its terminal functionality can undergo a bond forming reaction with a terminal end of polymeric segment or a monomeric species that can be converted into a terminal end of a polymeric segment. In other embodiments of the invention, at least one of the D units, A units or terminal ends of the DA polymeric sequences can be bonded to functionality that can self associate or cross-associate with plurally functional additives to form a super-molecular structure through non-covalent interactions such as hydrogen bonding, ion-dipole, ion pairing, ion chelation, dipole-dipole, or other non-covalent bonding forces. For example, some D units may be substituted with specific polyol groups that are readily solvated by a solvent, but strongly associates specifically with one or more other polyol groups of the DA polymer or of an additive upon removal of the solvent to form a super-molecular DA polymer complex.

The novel DA polymers according to embodiments of the invention display high optical contrasts in the visible region and possess switching speeds and switching stability that are superior to those which have been previously reported for blue ECPs. These solution processable blue-to-transmissive polymers are advantageous for reflective and transmissive electrochromic devices (ECDs) due to the combination of the solubility, which allows lower fabrication costs and good scalability, and other physical properties that allows improved and electro-optic and mechanical properties compared to traditional blue-to-transmissive ECP counterparts. Traditional counterparts have suffered for development of devices because of being too difficult to synthesize on scale, once synthesized being difficult to process, particularly for organic electrolyte based devices, and because the ECPs have consistently lacked with respect to optical contrast and switching speed.

In one embodiment of the invention, the blue or green-to-transmissive DA polymers have DA polymeric sequences of the structures:

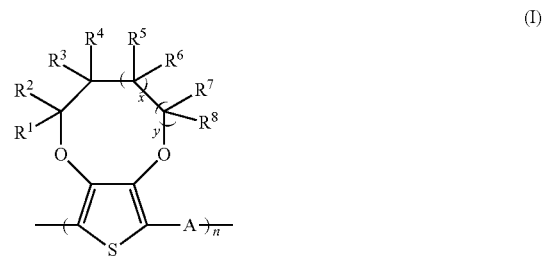

(I)

where A is an acceptor unit, n is 2 to 200,000, x is 0 or 1, y is 0 or 1, and $R^1, R^2, R^3, R^4, R^5, R^6, R^7$ and $R^8$ are independently H, $C_1$-$C_{30}$ alkyl, $C_2$-$C_{30}$ alkenyl, $C_2$-$C_{30}$ alkynyl, $C_6$-$C_{14}$ aryl, $C_7$-$C_{30}$ arylalkyl, $C_8$-$C_{30}$ arylalkenyl, $C_8$-$C_{30}$ arylalkynyl, hydroxy, $C_1$-$C_{30}$ alkoxy, $C_6$-$C_{14}$ aryloxy, $C_7$-$C_{30}$ arylalkyloxy, $C_2$-$C_{30}$ alkenyloxy, $C_2$-$C_{30}$ alkynyloxy, $C_8$-$C_{30}$ arylalkenyloxy, $C_8$-$C_{30}$ arylalkynyloxy, $CO_2H$, $C_2$-$C_{30}$ alkylester, $C_7$-$C_{15}$ arylester, $C_8$-$C_{30}$ alkylarylester, $C_3$-$C_{30}$ alkenylester, $C_3$-$C_{30}$ alkynylester, $NH_2$, $C_1$-$C_{30}$ alkylamino, $C_6$-$C_{14}$ arylamino, $C_7$-$C_{30}$ (arylalkyl)amino, $C_2$-$C_{30}$ alkenylamino, $C_2$-$C_{30}$ alkynylamino, $C_8$-$C_{30}$ (arylalkenyl)amino, $C_8$-$C_{30}$ (arylalkynyl)amino, $C_2$-$C_{30}$ dialkylamino, $C_{12}$-$C_{28}$ diarylamino, $C_4$-$C_{30}$ dialkenylamino, $C_4$-$C_{30}$ dialkynylamino, $C_7$-$C_{30}$ aryl(alkyl)amino, $C_7$-$C_{30}$ di(arylalkyl)amino, $C_8$-$C_{30}$ alkyl(arylalkyl)amino, $C_{15}$-$C_{30}$ aryl(arylalkyl)amino, $C_8$-$C_{30}$ alkenyl(aryl)amino, $C_8$-$C_{30}$alkynyl(aryl)amino $C(O)NH_2$ (amido), $C_2$-$C_{30}$ alkylamido, $C_7$-$C_{14}$ arylamido, $C_8$-$C_{30}$ (arylalkyl)amido, $C_2$-$C_{30}$ dialkylamido, $C_{12}$-$C_{28}$ diarylamido, $C_8$-$C_{30}$ aryl(alkyl)amido, $C_{15}$-$C_{30}$ di(arylalkyl)amido, $C_9$-$C_{30}$ alkyl(arylalkyl)amido, $C_{16}$-$C_{30}$ aryl(arylalkyl)amido, thiol, $C_1$-$C_{30}$ alkylhydroxy, $C_6$-$C_{14}$ arylhydroxy, $C_7$-$C_{30}$ arylalkylhydroxy, $C_3$-$C_{30}$ alkenylhydroxy, $C_3$-$C_{30}$ alkynylhydroxy, $C_8$-$C_{30}$ arylalkenylhydroxy, $C_8$-$C_{30}$ arylalkynylhydroxy, $C_3$-$C_{30}$ polyether, $C_3$-$C_{30}$ polyetherester, $C_3$-$C_{30}$ polyester $C_3$-$C_{30}$ polyamino, $C_3$-$C_{30}$ polyaminoamido, $C_3$-$C_{30}$ polyaminoether, $C_3$-$C_{30}$ polyaminoester, or $C_3$-$C_{30}$ polyamidoester, wherein alkyl can be straight, branched, multiply branched, cyclic, or polycyclic where cyclic and polycyclics can be unsubstituted, substituted, or polysubstituted, alkenyl can be a monoene, conjugated or non-conjugated polyene, straight, branched, multiply branched, cyclic, or polycyclic, terminal or internal, substituted at any carbon, E or Z isomers or mixture thereof, alkynes can be mono-yne, conjugated or non-conjugated poly-yne, terminal or internal, substituted at any carbon, aryl groups can be cyclic, fused or unfused polycyclic of any geometry, asymmetric functional groups, such as ester and amido, can have either orientation with respect to the alkylenedioxythiophene rings, poly can be 2 or more. Heteroatoms in substituents $R^1$-$R^8$ can be at any position of those substituents. For example an oxygen of an ether or ester or a nitrogen of an amine or amide can be in the alpha, beta, gamma or any other position relative to the point of attachment to the 3,4-alkylenedioxythiophene. Heteroatom containing substituents can have a plurality of heteroatoms, for example ether can be a monoether, a diether or a polyether, amine can be a monoamine, a diamine or a polyamine, ester can be a monoester, a diether, or a polyester, and amide can be a monoamide, a diamide or a polyamide. Ethers and esters groups can be thioethers, thioesters and hydroxy groups can be thiol (mercapto) groups, where sulfur is substituted for oxygen. In one embodiment of the invention, x is 1, y is 0, and $R^1$, $R^2$, $R^5$ and $R^6$ are hydrogen and $R^3$=$R^4$≠H. In one embodiment of the invention x is 1, y is 0, and $R^1$, $R^2$, $R^5$ and $R^6$ are hydrogen and $R^3$=$R^4$=$CH_2OR$ where R is an alkyl group.

In other embodiments of the invention the blue or green-to-transmissive DA polymers have polymers have DA polymeric sequences of the structures:

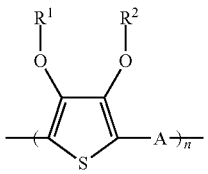

(II)

where A is an acceptor unit, n is 2 to 200,000, and $R^1$ and $R^2$ are independently H, $C_1$-$C_{30}$ alkyl, $C_2$-$C_{30}$ alkenyl, $C_2$-$C_{30}$ alkynyl, $C_6$-$C_{14}$ aryl, $C_7$-$C_{30}$ arylalkyl, $C_8$-$C_{30}$ arylalkenyl, $C_8$-$C_{30}$ arylalkynyl, $C_2$-$C_{30}$ alkylester, $C_7$-$C_{15}$ arylester, $C_8$-$C_{30}$ alkylarylester, $C_3$-$C_{30}$ alkenylester, $C_3$-$C_{30}$ alkynylester, $NH_2$, $C_1$-$C_{30}$ alkylamino, $C_6$-$C_{14}$ arylamino, $C_7$-$C_{30}$ (arylalkyl)amino, $C_2$-$C_{30}$ alkenylamino, $C_2$-$C_{30}$ alkynylamino, $C_8$-$C_{30}$ (arylalkenyl)amino, $C_8$-$C_{30}$ (arylalkynyl)amino, $C_2$-$C_{30}$ dialkylamino, $C_{12}$-$C_{28}$ diarylamino, $C_4$-$C_{30}$ dialkenylamino, $C_4$-$C_{30}$ dialkynylamino, $C_7$-$C_{30}$ aryl(alkyl)amino, $C_7$-$C_{30}$ di(arylalkyl)amino, $C_8$-$C_{30}$ alkyl(arylalkyl)amino, $C_{15}$-$C_{30}$ aryl(arylalkyl)amino, $C_8$-$C_{30}$ alkenyl(aryl)amino, $C_8$-$C_{30}$ alkynyl(aryl)amino $C(O)NH_2$ (amido), $C_2$-$C_{30}$ alkylamido, $C_7$-$C_{14}$ arylamido, $C_8$-$C_{30}$ (arylalkyl)amido, $C_2$-$C_{30}$ dialkylamido, $C_{12}$-$C_{28}$ diarylamido, $C_8$-$C_{30}$ aryl(alkyl)amido, $C_{15}$-$C_{30}$ di(arylalkyl)amido, $C_9$-$C_{30}$ alkyl(arylalkyl)amido, $C_{16}$-$C_{30}$ aryl(arylalkyl)amido, thiol, $C_1$-$C_{30}$ alkylhydroxy, $C_6$-$C_{14}$ arylhydroxy, $C_7$-$C_{30}$ arylalkylhydroxy, $C_3$-$C_{30}$ alkenylhydroxy, $C_3$-$C_{30}$ alkynylhydroxy, $C_8$-$C_{30}$ arylalkenylhydroxy, $C_8$-$C_{30}$ arylalkynylhydroxy, $C_3$-$C_{30}$ polyether, $C_3$-$C_{30}$ polyetherester, $C_3$-$C_{30}$ polyester $C_3$-$C_{30}$ polyamino, $C_3$-$C_{30}$ polyaminoamido, $C_3$-$C_{30}$ polyaminoether, $C_3$-$C_{30}$ polyaminoester, or $C_3$-$C_{30}$ polyamidoester, wherein alkyl can be straight, branched, multiply branched, cyclic, or polycyclic where cyclic and polycyclics can be unsubstituted, substituted, or polysubstituted, alkenyl can be a monoene, conjugated or non-conjugated polyene, straight, branched, multiply branched, cyclic, or polycyclic, terminal or internal, substituted at any carbon, E or Z isomers or mixture thereof, alkynes can be mono-yne, conjugated or non-conjugated poly-yne, terminal or internal, substituted at any carbon, aryl groups can be cyclic, fused or unfused polycyclic of any geometry, asymmetric functional groups, such as ester and amido, can have either orientation with respect to the 3,4-dioxythiophene rings, poly can be 2 or more. Heteroatoms in substituents $R^1$ and $R^2$ can be at any reasonable position of those substituents. For example an oxygen of an ether or ester or a nitrogen of an amine or amide can be in the beta, gamma or any other position relative to the point of attachment to the 3,4-dioxythiophene, but not the alpha position. Heteroatom containing substituents can have a plurality of heteroatoms, for example ether can be a monoether, a diether or a polyether, amine can be a monoamine, a diamine or a polyamine, ester can be a monoester, a diester, or a polyester, and amide can be a monoamide, a diamide or a polyamide. Ethers and esters groups can be thioethers, thioesters and hydroxy groups can be thiol (mercapto) groups, where sulfur is substituted for oxygen.

In other embodiments of the invention the blue or green-to-transmissive DA polymers have DA polymeric sequences of the structures:

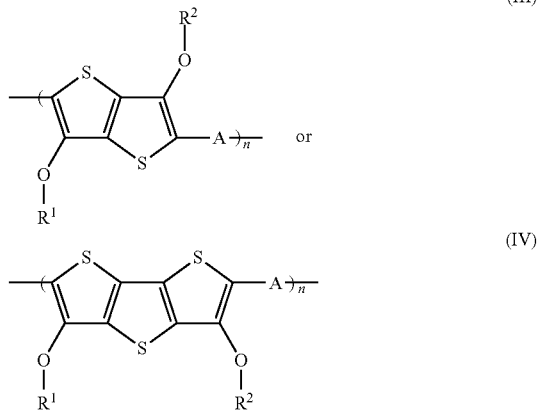

where A is an acceptor unit, n is 2 to 200,000, and $R^1$ and $R^2$ are independently H, $C_1$-$C_{30}$ alkyl, $C_2$-$C_{30}$ alkenyl, $C_2$-$C_{30}$ alkynyl, $C_6$-$C_{14}$ aryl, $C_7$-$C_{30}$ arylalkyl, $C_8$-$C_{30}$ arylalkenyl, $C_8$-$C_{30}$ arylalkynyl, $C_2$-$C_{30}$ alkylester, $C_7$-$C_{15}$ arylester, $C_8$-$C_{30}$ alkylarylester, $C_3$-$C_{30}$ alkenylester, $C_3$-$C_{30}$ alkynylester, $NH_2$, $C_1$-$C_{30}$ alkylamino, $C_6$-$C_{14}$ arylamino, $C_7$-$C_{30}$ (arylalkyl)amino, $C_2$-$C_{30}$ alkenylamino, $C_2$-$C_{30}$ alkynylamino, $C_8$-$C_{30}$ (arylalkenyl)amino, $C_8$-$C_{30}$ (arylalkynyl)amino, $C_2$-$C_{30}$ dialkylamino, $C_{12}$-$C_{28}$ diarylamino, $C_4$-$C_{30}$ dialkenylamino, $C_4$-$C_{30}$ dialkynylamino, $C_7$-$C_{30}$ aryl(alkyl)amino, $C_7$-$C_{30}$ di(arylalkyl)amino, $C_8$-$C_{30}$ alkyl(arylalkyl)amino, $C_{15}$-$C_{30}$ aryl(arylalkyl)amino, $C_8$-$C_{30}$ alkenyl(aryl)amino, $C_8$-$C_{30}$ alkynyl(aryl)amino $C(O)NH_2$ (amido), $C_2$-$C_{30}$ alkylamido, $C_7$-$C_{14}$ arylamido, $C_8$-$C_{30}$ (arylalkyl)amido, $C_2$-$C_{30}$ dialkylamido, $C_{12}$-$C_{28}$ diarylamido, $C_8$-$C_{30}$ aryl(alkyl)amido, $C_{15}$-$C_{30}$ di(arylalkyl)amido, $C_9$-$C_{30}$ alkyl(arylalkyl)amido, $C_{16}$-$C_{30}$ aryl(arylalkyl)amido, thiol, $C_1$-$C_{30}$ alkylhydroxy, $C_6$-$C_{14}$ arylhydroxy, $C_7$-$C_{30}$ arylalkylhydroxy, $C_3$-$C_{30}$ alkenylhydroxy, $C_3$-$C_{30}$ alkynylhydroxy, $C_8$-$C_{30}$ arylalkenylhydroxy, $C_8$-$C_{30}$ arylalkynylhydroxy, $C_3$-$C_{30}$ polyether, $C_3$-$C_{30}$ polyetherester, $C_3$-$C_{30}$ polyester $C_3$-$C_{30}$ polyamino, $C_3$-$C_{30}$ polyaminoamido, $C_3$-$C_{30}$ polyaminoether, $C_3$-$C_{30}$ polyaminoester, or $C_3$-$C_{30}$ polyamidoester, wherein alkyl can be straight, branched, multiply branched, cyclic, or polycyclic where cyclics and polycyclics can be unsubstituted, substituted, or polysubstituted, alkenyl can be a monoene, conjugated or non-conjugated polyene, straight, branched, multiply branched, cyclic, or polycyclic, terminal or internal, substituted at any carbon, E or Z isomers or mixture thereof, alkynes can be mono-yne, conjugated or non-conjugated poly-yne, terminal or internal, substituted at any carbon, aryl groups can be cyclic, fused or unfused polycyclic of any geometry, asymmetric functional groups, such as ester and amido, can have either orientation with respect to the 4,4'-dioxy-oligothiophene rings, poly can be 2 or more. Heteroatoms in substituents $R^1$ and $R^2$ can be at any reasonable position of those substituents. For example an oxygen of an ether or ester or a nitrogen of an amine or amide can be in the beta, gamma or any other position relative to the point of attachment to the 4,4'-dioxy-oligothiophene, but not the alpha position. Heteroatom containing substituents can have a plurality of heteroatoms, for example ether can be a monoether, a diether or a polyether, amine can be a monoamine, a diamine or a polyamine, ester can be a monoester, a diester, or a polyester, and amide can be a monoamide, a diamide or a polyamide. Ethers and esters groups can be thioethers, thioesters and hydroxy groups can be thiol (mercapto) groups, where sulfur is substituted for oxygen.

Figure 1:
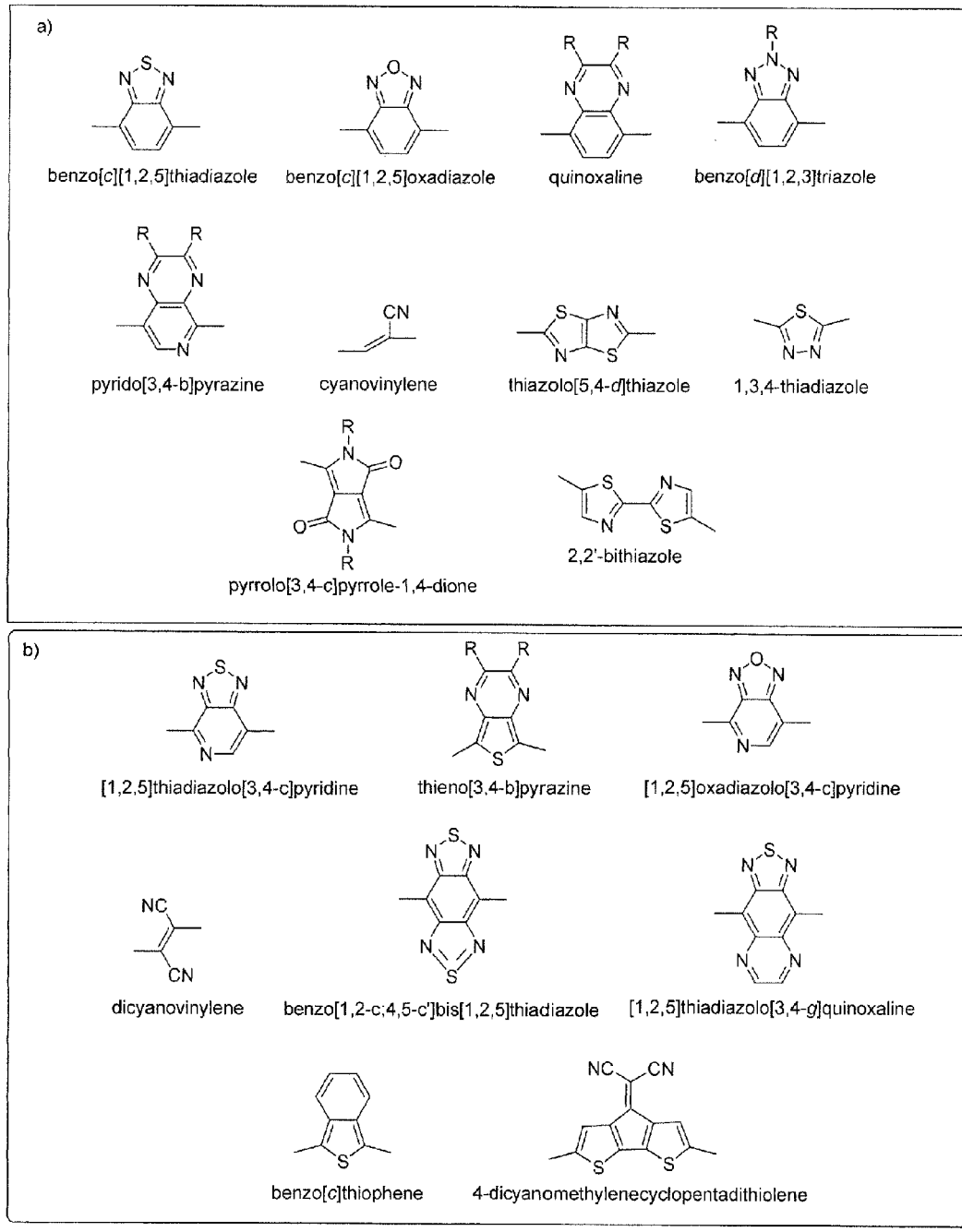
FIG. 1 shows structures of various electron poor acceptor units that can comprise A units in the DA polymers to give a)

The acceptor unit A can be electron-poor aromatic units or cyanovinylene units including, but not limited to, benzo[c][1,2,5]thiadiazole, benzo[c][1,2,5]oxadiazole, quinoxaline, benzo[d][1,2,3]triazole, pyrido[3,4-b]pyrazine, cyanovinylene, thiazolo[5,4-d]thiazole, 1,3,4-thiadiazole, pyrrolo[3,4-c]pyrrole-1,4-dione, 2,2'-bithiazole, thieno[3,4-b]pyrazine, [1,2,5]oxadiazolo[3,4-c]pyridine, dicyanovinylene, benzo[1,2-c;4,5-c']bis[1,2,5]thiadiazole, [1,2,5]thiadiazolo[3,4-g]quinoxaline, benzo[c]thiophene, 4-dicyanomethylenecyclopenta-dithiolene or any derivatives thereof. These examples are shown in FIG. 1. The structure of A largely affects the color exhibited by the DA polymer. In embodiments of the invention, the A units can be substituted to impart solubility. For example, any the R groups of or any of the hydrogen substituents on the A units of FIG. 1 can be replaced with equivalents of $R^1$ and $R^2$ of the DA polymer (II).

In embodiments of the invention the DA polymer of structure I, where x is 1 and y is 0, can be a substituted propylene bridge of a ProDOT-A ECPs that permits the tuning of the electrochromic features and to employ a desired device fabrication method. In some embodiments of the invention the substituents comprise non-polar side chains. In other embodiments the substituents comprise polar or ionic side chains, including but not exclusive to: ether, ester, amide, carboxylic acid, sulfonate, and amine functionalized chains. By the incorporation of polar or ionic substituents, the ProDOT-A ECPs can be designed to adsorb on metal or metal oxide surfaces, for example, but not limited to, titania for use in solar cells (Graetzel Cells) or other devices. Having a substituent that can impart a very different solubility to that of another ECP can permit the formation of a complex electrochromic device by a layer-by-layer deposition process.

In some embodiments of the invention the ProDOT-A ECPs contain reactive $R^1$ through $R^6$ groups that permit processing of the ProDOT-A ECP into a film that can be subsequently converted to a different ProDOT-A ECP, for example, a soluble film can be converted into an insoluble film. For example, where $R^3$ and $R^4$ are di-ester groups, conversion to carboxylic acid groups can be carried out in the manner disclosed in Reynolds et al. International Patent Application Publication WO 2007/087587A2, Aug. 2, 2007, and incorporated by reference herein. If desired, the di-acid can be subsequently converted into a carboxylate salt.

The blue-to-transmissive ProDOT-A ECP according to embodiments of the invention can be employed in a wide variety of applications. For example, one such application is as active layers in bulk heterojunction solar cells. The $R^1$ and of $R^2$ groups can be of a structure to direct and enhance adsorption of the ProDOT-A ECP to metal oxides through polar carboxylate or even phosphate functionalities for use in dye sensitized solar cells, where the ProDOT-A DA polymer functions as the active light absorbing layer. Another use for ProDOT-A DA polymers according to embodiments of the invention is that of the charge transport layers in field-effect transistor devices.

A blue-to-transmissive ProDOT-BTD DA polymer according to an embodiment of the invention displays an absorption spectra consisting of two bands. One band absorbs in the red portion of the spectrum centered at $\lambda_{max}$ of about 650 nm, and one band centered in the UV portion of the spectrum at $\lambda_{max}$ of about 370 nm and displays significant light transmission that is centered in the blue region of the visible spectrum around 430 nm in the neutral state. Blue-to-transmissive DA polymers according to embodiments of the invention display a maximum of light transmission in the neutral state at 320-480 nm and green-to-transmissive DA polymers display a maximum of light transmission at 480 to 540 nm. Both of the absorbing bands bleach simultaneously upon oxidation, which ultimately yields a sufficiently transmissive oxidized state after passing through consistently less-saturated blue or green tones, as indicated in the composite spectra for a DA polymer according to an embodiment of the invention at different applied potentials shown in FIG. 2 for a ProDOT-BTD DA polymer where $R^3$ and $R^4$ are $C_8$ alkyloxy groups. A large decrease of the absorbencies from the neutral to the fully oxidized state allows the DA polymer to be employed in a large number of applications. In general, a difference in absorbance of at least 20% is desired for useful ECP devices. This ProDOT-BTD DA polymer reversibly switches over a potential window of less than 1.5 V, which permits use as a desirable low-voltage ECD. Photographs of an exemplary film in its neutral and fully oxidized states are shown in FIG. 3.

Other embodiments of the invention are directed to a method of preparing the novel DA polymers by cross-coupling reaction of a nucleophilic monomeric acceptor unit and an electrophilic monomeric donor unit by an inverted Suzuki condensation. For example, the method yields an alternation of the donor ProDOT and acceptor BTD repeating units in the DA polymer chain. The present method allows sufficient molecular weight DA polymers because reliable purifications of the nucleophilic BTD acceptor monomer and the ProDOT donor monomer can be effectively carried out. As with virtually all cross-coupling step-growth polymerizations, the degree of polymerization for this DA polymer is limited by any deviation from stoichiometry. Hence the purity of both monomers is critical to achieving a sufficiently large polymer for use in many viable electrochromic devices.

In one embodiment of the method, the cross-coupling polymerization is an inverted Suzuki condensation, which departs from traditional cross-coupling methods, such as a traditional Suzuki condensation where the nucleophile, for example, a disubstituted organotin, boron, zinc, or magnesium reagent, is an electron rich donor aryl group and the electrophile is an electron poor acceptor aryl group. Traditional cross-coupling polymerization methods are not viable for preparation of the novel DA polymers because the purification of metallated nucleophilic ProDOT monomers has been and remains elusive due to their inherent instability. In one embodiment of the inventive method, an inverted Suzuki polymerization is carried out using an acceptor (BTD) as the nucleophile and a donor (ProDOT) as the electrophile. The cross-coupling can be catalyzed, for example, by the inclusion of a palladium or other metallic catalyst.

Contrary to the sole example of the use of an inverted Suzuki condensation to prepare a BTD-CDT DA polymer, the method according to embodiments of the invention can employ a base-free system condensation of a diboronic ester of benzothiadiazole with dibrominated derivatives of Pro-DOT. The coupling conditions are environmentally friendly as organoboron reagents generally have minimal toxicity. Suzuki coupling conditions can be mild, with base hydrolysis being avoided when necessary. For example, a fluoride-mediated Suzuki condensation, in a manner disclosed in Brookins et al., *Macromolecules,* 2007, 40, 3524, incorporated herein by reference, allows a wide variety of side groups to be incorporated. By avoidance of a base, high yields of DA polymers are achieved and easily purified, unlike that reported in the background for the BTD-CDT DA polymer prepared with the use of a base. Unlike the BTD-CDT DA polymer, which can be prepared by a normal Suzuki coupling, DA polymers according to embodiments of the invention require an inverse Suzuki condensation or other cross coupling reaction.

Embodiments of the invention are directed to a method for the synthesis of alternating copolymers with 3,4-substituted dioxythiophene donor (D) units and any acceptor (A) units, as shown in Scheme 1, below. As can be seen in Scheme 1, the A monomer has any electron poor aromatic unit substituted with any boron moiety to act as the nucleophile in a cross-coupling reaction. The D monomers are any substituted 3,4-dioxythiophene 3,6-dialkoxythieno[3,2-b]thiophene or 3,5-dialkoxy-dithieno[3,2-b:2',3'-d]thiophene that is substituted at the carbon alpha to the sulfur atoms with leaving groups such as halogens, triflates, tosylates, mesylates, nosylates, trifluoroacetates or other substituted sulfonates that can act as the leaving group, and acts as the electrophile in the cross coupling reactions with the A monomers to yield strictly alternating DA polymers in the presence of a catalyst, as needed. In some embodiments of the invention the A units can be substituted with tin or zinc moieties rather than boron moieties. Other coupling reactions that can be used, include, but are not restricted to: Stille coupling, Kumada coupling, Hiyama coupling, and Negishi coupling. In some embodiments the D monomer have a pair of tin or zinc moieties and the A units are substituted with the leaving groups.

n B-A-B+n X-D-X→-[D-A]$_n$-    Scheme 1 where B is any boron comprising moiety, X is a leaving group and n is 2-200,000.

Methods and Materials

Exemplary synthesis of ProDOT-BTD DA polymers according to embodiments of the invention are shown in Scheme 2. An embodiment of this method uses diboronic esters of benzothiadiazole (1) in an inverse Suzuki polycondensation with dibrominated derivatives of ProDOT. Monomer 1 is easily purified where most impurities are removed by sublimation and the partially purified monomer is subsequently recrystallized. The use of a base or fluoride-activated Suzuki coupling allows ester (and other hydrolysis sensitive groups) functionalized ProDOTs to be polymerized. If desired, P3 is a diester (C(O)O-alkyl substituted), and can be defunctionalized after deposition to yield an intractable diacid (C(O)OH substituted) polymer.

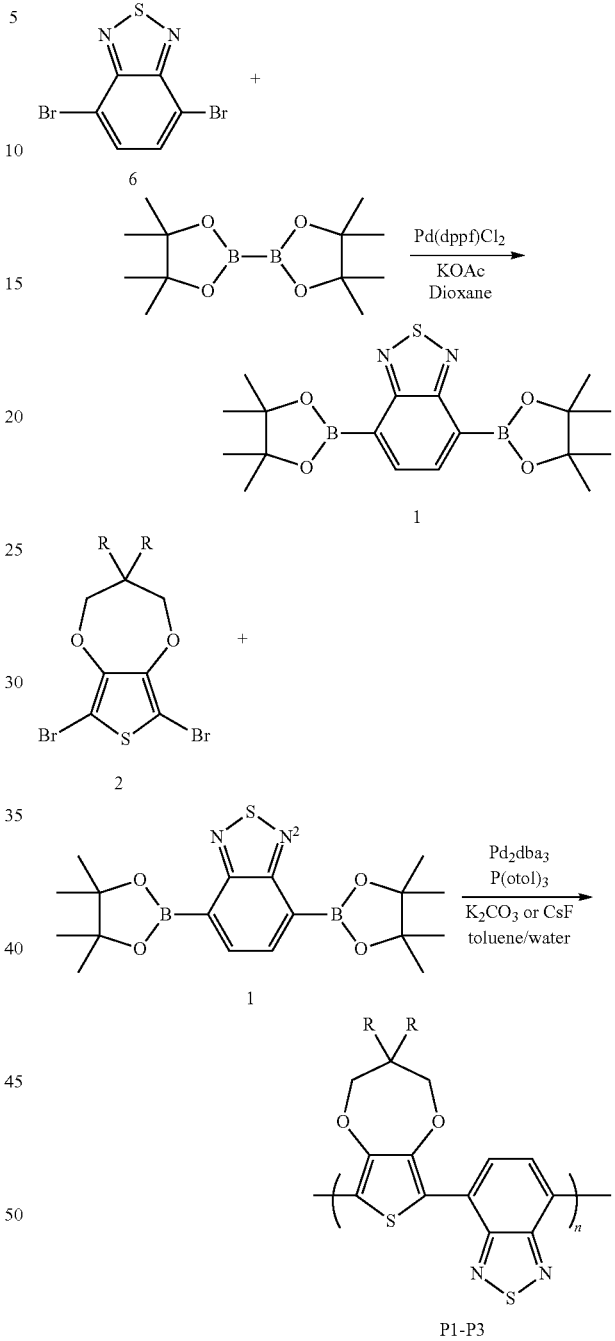

Scheme 2
Synthesis of alternating copolymers of ProDOT derivatives and BTD.

P1 = CH2O-n-octyl
P2 = CH2O-2-ethylhexyl
P3 = CH2COO-n-dodecyl

Other DA polymers according to embodiments of the invention are shown in Schemes 3 and 4, where Stille polymerization yields soluble alternating copolymers P4 and P5, where different donor and acceptor combinations are used. In P4, where thienopyrazine is used as the repeat unit in alternation with ProDOT, a green polymer is obtained with an absorption minimum at 550 nm is obtained, giving green colored materials. In P5, where 3,6-dialkoxythieno[3,2-b]

thiophene is used as a donor repeat unit alternating with BTD, a soluble blue-green polymer is achieved with an absorption minimum at 470 nm.

Scheme 3
Synthesis of alternating
ProDOT-thienopyrazine copolymers.

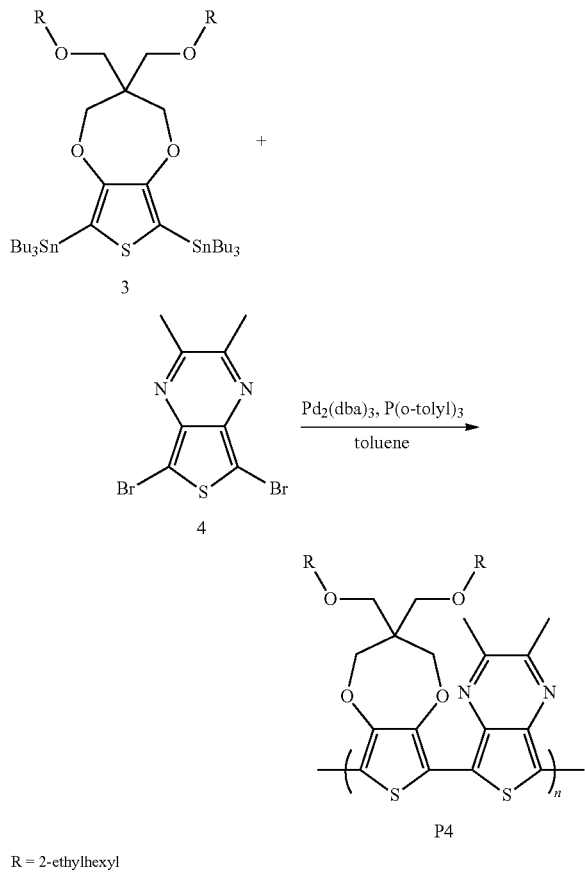

R = 2-ethylhexyl

Scheme 4.
Synthesis of alternating
3,6-dialkoxythieno [3,2-b]thiophene-BTD copolymers.

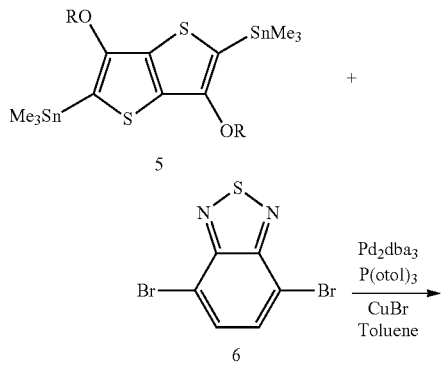

-continued

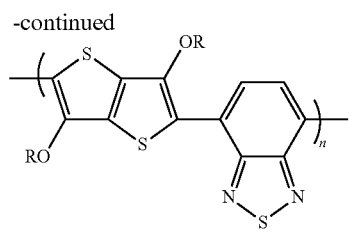

R = 2-ethylhexyl

Synthesis of Alternating DA Copolymers.

Pinacol ester-substituted BTD (1): A 100 mL Schlenk tube was charged with 4,7-dibromo-2,1,3-benzothiadiazole (4.00 g, 14.6 mmol) (6), bispinacolatodiboron (7.9 g, 31 mmol), potassium acetate (8.0 g, 81 mmol), and Pd(dppf)Cl$_2$CH$_2$Cl$_2$ (330 mg, 0.41 mmol, 3 mol %), and the flask was evacuated and backfilled with argon several times. 1,4-dioxane (60 mL) was then added, and the mixture was heated to 80-85° C. under vigorous stirring overnight. This mixture was then cooled to room temperature, and poured into a mixture of ethyl acetate (100 mL) and water (200 mL). The organic layer was collected and the aqueous layer was extracted with ethyl acetate (2×150 mL). The combined organic extracts were dried over MgSO$_4$ and evaporated. The remaining concentrate was taken up in 500 mL boiling hexanes, and the mixture was then allowed to cool to room temperature and filtered. The filtrate was evaporated, taken up in a minimum amount of acetonitrile, and filtered through a 1.5"×4" column of activated charcoal and celite (mixed, 50-50 wt/wt). The column was eluted with 400 mL acetonitrile and 400 mL ethyl acetate, and all of the colorless eluent was evaporated affording a greasy white solid. This solid was then sublimed (100° C., ~0.01 Torr) until no more volatile components remained (~6 h). The remaining residue which did not sublime was recrystallized from hexanes to give 2.5 g (47%) of white crystals (from an ice-cold hexanes fraction), mp=208.5-209.5. $^1$H NMR (CDCl$_3$): δ 8.12 (s, 2H), 1.43 (s, 24H). $^{13}$C NMR: δ 157.2, 137.9, 84.6, 25.1. Anal. calcd. for C$_{18}$H$_{26}$B$_2$N$_2$O$_4$S: C, 55.71; H, 6.73; N, 7.22; found C, 55.38; H, 6.87; N, 7.01.

General procedure for the polymerization of P1-P3: A 50 mL schlenk tube was charged with a dibrominated ProDOT derivative (0.500 mmol), 2 (0.194 g, 0.500 mmol), K$_2$CO$_3$ or CsF (8 mmol), Pd$_2$dba$_3$ (9.1 mg, 10 μmol), P(o-tol)$_3$ (12 mg, 40 μmol), and a drop of aliquat 336. The flask was then evacuated and backfilled with argon several times. Toluene (12 mL) and water (4 mL) were then added, and the mixture was heated to 80-85° C. and stirred for 24 hours. Fresh Pd$_2$dba$_3$ (9.1 mg, 10 μmol) and P(o-tol)$_3$ (12 mg, 40 μmol) were added under high flow of argon, and the mixture was stirred for an additional 48 h at 80-85° C. The polymer was then precipitated from a mixture of 20% water and methanol, washed by soxhlet extraction with methanol (overnight), and finally extracted with chloroform. The chloroform soluble fraction was then concentrated, reprecipitated from methanol, and dried under vacuum to yield a dark blue solid. P1: Yield 98%. GPC M$_w$=43,870, M$_n$=23,260, PDI=1.89. $^1$H NMR (CDCl$_3$): δ 8.45 (br s, 2H), 4.35 (br s, 4H), 3.66 (br s, 4H), 3.39 (br s, 4H), 1.6-1.2 (br, 18H), 0.92 (br s, 12H) Anal. calcd. for C$_{31}$H$_{44}$N$_2$O$_4$S$_2$ C, 65.00; H, 7.74; N, 4.89. Found C, 64.67; H, 8.11; N, 4.77. P2: Yield 97%. GPC M$_w$=25,000, M$_n$=15,000, PDI=1.67. $^1$H NMR (CDCl$_3$): δ 8.44 (br s, 2H); 4.35 (br s, 4H); 3.67 (br s, 4H); 3.50 (br s, 4H); 1.6-1.2 (br, 24H); 0.88 (br, 6H) Anal. calcd. for C$_{31}$H$_{44}$N$_2$O$_4$S$_2$ C, 65.00;

H, 7.74; N, 4.89. Found C, 64.90; H, 8.33; N, 4.61. P3: Yield 97%. GPC $M_w$=14,900, $M_n$=11,100, PDI=1.34. $^1$H NMR (CDCl$_3$); δ 8.44 (br s, 2H), 4.48 (bs, 4H), 4.13 (br s, 4H), 2.91 (br s, 4H), 1.67 (bs, 4H), 1.24 (br, 14 H), 0.88 (br s, 6H). Anal. calcd. for $C_{41}H_{60}N_2O_6S_2$ C, 66.45; H, 8.16; N, 3.78. Found C, 66.30; H, 8.82; N, 3.71.

Synthesis of P4: A solution of distannyl ProDOT-(CH$_2$OEtHx)$_2$ (3) (0.255 g, 0.25 mmol), 5,7-dibromothieno[3,4-b]pyrazine (0.081 g, 0.25 mmol), tris(dibenzylideneacetone)dipalladium (0) (4.6 mg, 0.005 mmol) and tri(o-tolyl) phosphine (6.1 mg, 0.02 mmol) in toluene (10 mL) was degassed three times by successive freeze-pump-thaw cycles and heated at 100° C. for 36 h in a silicone oil bath. The solution was then precipitated into methanol (300 mL). The precipitate was filtered through a Soxhlet thimble and purified via Soxhlet extraction for 24 hours with methanol and then 48 hours with hexane. The polymer was extracted with chloroform, concentrated by evaporation, and then precipitated into methanol again (300 mL). The collected polymer was a dark green solid (0.11 g, 73%). GPC analysis: $M_n$: 5200 da, $M_w$: 7000 da, PDI: 1.3.

Synthesis of P5: A 50 mL Schlenk tube was charged with 2,5-di(trimethylstannyl)-3,6-di-(2-ethylhexyloxy)theino[3,2-b]thiophene (5) (0.541 g, 0.749 mmol), 6 (0.217 g, 0.738mmol), Pd$_2$dba$_3$ (6 mg, 7 μmol), P(o-tol)$_3$ (12 mg, 40 μmol), and CuBr (30 mg, 210 μmol). Toluene (20 mL) was then added, and the solution was heated to 100 C for 5 days. Bromobenzene (2 mL) was then added, and the solution was stirred for 4 hrs. A spatula tip of diethylammonium dithiocarbamate was then added and the solution was stirred for 1 hour then cooled to room temperature. The solution was pipette into methanol, and the resulting solid was collected on a cellulose thimble. The solid was then extracted (Soxhlet) with methanol (1 day), ethyl acetate (6 hours), and finally chloroform. The chloroform soluble fraction was then pipetted into methanol again, and the solids were collected, and dried overnight in vacuo to give 284 mg (73%) of a dark solid.

Film Properties

Thin films of P1, where R is octyloxy, were spray-cast onto indium tin oxide (ITO) coated glass slides from solution (~2 mg/mL) from a 1:1 toluene and chloroform mixed solvent. The film was redox cycled until stable and reproducible switching was achieved. Electrochemical oxidation of the film was carried out in 0.1M LiBF$_4$/propylene carbonate solution using a silver wire quasi-reference electrode (QRE) and platinum wire counter electrode. FIG. 2 shows changes in the UV-visible absorption spectrum as a function of this electrochemical oxidation. As can be seen, the intensity of both of the absorption bands decrease significantly and simultaneously upon oxidation. As the UV-visible absorption bands decrease in intensity, new absorption bands in the near-infrared region of the spectrum arise, as is common in ECPs. At the absorption maximum near 625 nm, a reversible change in transmittance of 53% is observed.

The relative luminance change, estimating the brightness of light as a function of the brightness of the light source calibrated to the sensitivity to the human eye, was measured from various film thicknesses (Abs max 0.61, 1.14, 1.65), of P2 where R is 2-ethylhexyl, at various doping levels induced by electrochemical oxidation. As shown in FIG. 4, spray-cast P2 exhibits a relative luminance change of up to 48% depending on the thickness of the film. P2 undergoes a full switch in a potential window of ~0.8V.

The speed at which the DA polymers can be switched from one state to another is shown in FIG. 5 for P1 where R is octyl, which shows the change in absorbance at the $\lambda_{max}$ of a spray-cast film as a function of time. Potential square waves (−0.4V to 0.95V vs. Ag QRE) were applied to the film suspended in a solution of LiBF$_4$ in propylene carbonate using a platinum wire counter electrode and a silver wire QRE. As can be seen by FIG. 5, the film exhibits switching from a transmittance of 25% at 642 nm to 70% in less than 0.6 seconds and the reverse switch occurs in less than 0.4 seconds. This is an unusually fast switching for a blue ECP.

Thin films of P2 and P3 were also spray-cast onto indium tin oxide (ITO) coated glass slides from solution (~2 mg/mL) from toluene solutions, and their spectroelectrochemical responses are shown in FIGS. 6 and 7, respectively. The polymers behave similarly to P1, where at negative potentials strong absorptions in the visible region are apparent, and upon electrochemical oxidation the absorption bands significantly reduce in intensity, thus giving highly transmissive films upon full oxidation.

Different repeat units of the DA polymers allow color tunability for the alternating copolymers. FIG. 8 shows the spectroelectrochemical analysis of P4, where theinopyrazine has replaced BTD as the acceptor moiety. The green polymer produced (absorption minimum around 550 nm in neutral state) bleaches significantly upon oxidation. Also, P5 was produced, where the 3,6-dialkoxythieno[3,2-b]thiophene moiety replaced ProDOT as the donor alternating with BTD. As shown in FIG. 9, P5 effectively bleached from its blue-green colored state to a transmissive oxidized state upon electrochemical an increase in potential from 0-1 V vs. Fc/Fc$^+$, giving a reversible change in transmittance of 40% at 709 nm.

As for P1, the switching speed of P2 and P3 were also evaluated by potential square wave absorptometry. As seen in FIGS. 10 and 11, variation of the period of time between potential square waves from 10 s to 1 s causes little reduction in the contrast ratio, and both polymers reached 95% of a full switch in less than one second.

A comparative study of the relative luminance change was carried out where estimates of the brightness of light as a function of the brightness of the light source calibrated to the sensitivity to the human eye, was measured from various film thicknesses (Abs max 0.8, 1.3, 1.8), for P1 at various doping levels induced by electrochemical oxidation. As shown in FIG. 12, spray-cast P1 exhibits a relative luminance change of up to 48% depending on the thickness of the film. P1 undergoes a full switch in a potential window of ~0.8V. In addition, P2 and P3 also undergo large changes in relative luminance upon oxidation, as illustrated by FIGS. 13 and 14, respectively.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. An alternating donor-acceptor $(DA)_n$ polymer comprising:
   a plurality of donor units comprising 3,4-alkylenedioxythiophenes substituted on the alkylene bridge; and
   a plurality of acceptor units comprising electron-poor aromatic units or cyanovinylene units alternating with said donor units in one or more polymeric $(DA)_n$ sequences of n=4 to 200,000 units, wherein said $(DA)_n$ polymer displays a blue or green color in a neutral state and is transmissive in an oxidized state and wherein said $(DA)_n$ polymer is soluble in at least one solvent.

2. The $(DA)_n$ polymer of claim 1, wherein said 3,4-alkylenedioxythiophenes substituted on the alkylene bridge comprise:

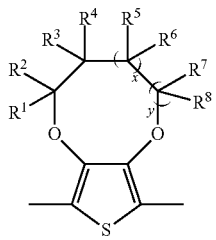

where x is 0 or 1, y is 0 or 1, and $R^1$, $R^2$, $R^3$, $R^4$, $R^5$, $R^6$, $R^7$ and $R^8$ are independently H, $C_1$-$C_{30}$ alkyl, $C_2$-$C_{30}$ alkenyl, $C_2$-$C_{30}$ alkynyl, $C_6$-$C_{14}$ aryl, $C_7$-$C_{30}$ arylalkyl, $C_8$-$C_{30}$ arylalkenyl, $C_8$-$C_{30}$ arylalkynyl, hydroxy, $C_1$-$C_{30}$ alkoxy, $C_6$-$C_{14}$ aryloxy, $C_7$-$C_{30}$ arylalkyloxy, $C_2$-$C_{30}$ alkenyloxy, $C_2$-$C_{30}$ alkynyloxy, $C_8$-$C_{30}$ arylalkenyloxy, $C_8$-$C_{30}$ arylalkynyloxy, $CO_2H$, $C_2$-$C_{30}$ alkylester, $C_7$-$C_{15}$ arylester, $C_8$-$C_{30}$ alkylarylester, $C_3$-$C_{30}$ alkenylester, $C_3$-$C_{30}$ alkynylester, $NH_2$, $C_1$-$C_{30}$ alkylamino, $C_6$-$C_{14}$ arylamino, $C_7$-$C_{30}$ (arylalkyl)amino, $C_2$-$C_{30}$ alkenylamino, $C_2$-$C_{30}$ alkynylamino, $C_8$-$C_{30}$ (arylalkenyl)amino, $C_8$-$C_{30}$ (arylalkynyl)amino, $C_2$-$C_{30}$ dialkylamino, $C_{12}$-$C_{28}$ diarylamino, $C_4$-$C_{30}$ dialkenylamino, $C_4$-$C_{30}$ dialkynylamino, $C_7$-$C_{30}$ aryl(alkyl)amino, $C_7$-$C_{30}$ di(arylalkyl)amino, $C_8$-$C_{30}$ alkyl(arylalkyl)amino, $C_{15}$-$C_{30}$ aryl(arylalkyl)amino, $C_8$-$C_{30}$ alkenyl(aryl)amino, $C_8$-$C_{30}$ alkynyl(aryl)amino C(O)$NH_2$ (amido), $C_2$-$C_{30}$ alkylamido, $C_7$-$C_{14}$ arylamido, $C_8$-$C_{30}$ (arylalkyl)amido, $C_2$-$C_{30}$ dialkylamido, $C_{12}$-$C_{28}$ diarylamido, $C_8$-$C_{30}$ aryl(alkyl)amido, $C_{15}$-$C_{30}$ di(arylalkyl)amido, $C_9$-$C_{30}$ alkyl(arylalkyl)amido, $C_{16}$-$C_{30}$ aryl(arylalkyl)amido, thiol, $C_1$-$C_{30}$ alkyhydroxy, $C_6$-$C_{14}$ arylhydroxy, $C_7$-$C_{30}$ arylalkylhydroxy, $C_3$-$C_{30}$ alkenylhydroxy, $C_3$-$C_{30}$ alkynylhydroxy, $C_8$-$C_{30}$ arylalkenylhydroxy, $C_8$-$C_{30}$ arylalkynylhydroxy, $C_3$-$C_{30}$ polyether, $C_3$-$C_{30}$ polyetherester, $C_3$-$C_{30}$ polyester $C_3$-$C_{30}$ polyamino, $C_3$-$C_{30}$ polyaminoamido, $C_3$-$C_{30}$ polyaminoether, $C_3$-$C_{30}$ polyaminoester, or $C_3$-$C_{30}$ polyamidoester.

3. The $(DA)_n$ polymer of claim 1, wherein said acceptor unit comprises: benzo[c][1,2,5]thiadiazole, benzo[c][1,2,5]oxadiazole, quinoxaline, benzo[d][1,2,3]triazole, pyrido[3,4-b]pyrazine, cyanovinylene, thiazolo[5,4-d]thiazole, 1,3,4-thiadiazole, pyrrolo[3,4-c]pyrrole-1,4-dione, 2,2'-bithiazole, [1,2,5]thiadiazolo[3,4-c]pyridine, thieno[3,4-b]pyrazine, [1,2,5]oxadiazolo[3,4-c]pyridine, dicyanovinylene, benzo[1,2-c;4,5-c']bis[1,2,5]thiadiazole, [1,2,5]thiadiazolo[3,4-g]quinoxaline, 4-dicyanomethylenecyclopentadithiolene, benzo[c]thiophene or any derivative thereof.

4. The $(DA)_n$ polymer of claim 1, wherein said one or more polymeric sequences comprise one or more portions of a block copolymer, graft copolymer, polymer network or super-molecular structure.

5. The $(DA)_n$ polymer of claim 1, wherein the neutral state polymer exhibits a window of transmission in the range 320-560 nm with a maximum transmission at 400 to 500 nm.

6. The $(DA)_n$ polymer of claim 5, wherein light absorbance at maxima of visible bands adjacent to said window of transmission in said neutral state are at least 20% greater than that in a fully oxidized state.

7. The $(DA)_n$ polymer of claim 1, wherein said polymeric sequence comprises:

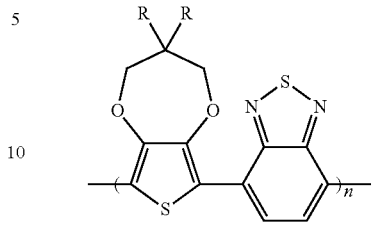

where R is $CH_2$O-n-octyl, $CH_2$O-2-ethylhexyl, or $CH_2$COO-n-dodecyl and n is 4 to 200,000.

8. The $(DA)_n$ polymer of claim 1, wherein said polymeric sequence comprises:

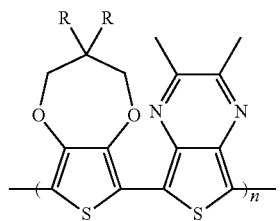

where R is $CH_2$O-n-octyl, $CH_2$O-2-ethylhexyl, or $CH_2$COO-n-dodecyl and n is 4 to 200,000.

9. A method for preparation of a $(DA)_n$ polymer of claim 1 comprising:

combining in one or more solvents a plurality of at least one nucleophilic aromatic monomeric acceptor units that is disubstituted with groups comprising tin, boron, zinc, silicon, or magnesium and a plurality of at least one electrophilic monomeric donor unit comprising a 3,4-alkylenedioxythiophene substituted on the alkylene bridge having a pair of leaving groups; or combining in one or more solvents a plurality of at least one electrophilic monomeric donor unit comprising a 3,4-alkylenedioxythiophene substituted on the alkylene bridge that is disubstituted with groups comprising tin, boron, zinc, silicon, or magnesium and a plurality of at least one nucleophilic aromatic monomeric acceptor units having a pair of leaving groups;

optionally adding a catalyst; and cross-coupling said monomeric donor units with said monomeric acceptor units to yield a $(DA)_n$ polymer with alternating donor and acceptor units that has a blue or green neutral state and a transmissive oxidized state and is soluble in at least one of said solvents.

10. The method of claim 9, wherein said monomeric acceptor unit comprises a benzothiadiazole unit or a thienopyrazine unit.

11. The method of claim 9, wherein said leaving group comprises halogen, triflate, tosylate, nosylate, trifluoroacetate, or mesylate.

12. The method of claim 11, wherein said halogen comprises bromine.

13. The method of claim 9, wherein said catalyst comprises a palladium or nickel comprising compound.

14. The method of claim 9, wherein said cross-coupling comprises a Stille coupling, Kumada coupling, Hiyama coupling, Negishi coupling or inverse Suzuki coupling.

15. The method of claim 9, wherein said cross-coupling comprises an inverse Suzuki condensation.

16. The method of claim 9, wherein said cross-coupling comprises a base free inverse Suzuki condensation.

* * * * *

UNITED STATES PATENT AND TRADEMARK OFFICE
CERTIFICATE OF CORRECTION

PATENT NO. : 8,394,917 B2
APPLICATION NO. : 12/829903
DATED : March 12, 2013
INVENTOR(S) : Chad Martin Amb, Pierre Marc Beaujuge and John R. Reynolds It is certified that error appears in the above-identified patent and that said Letters Patent is hereby corrected as shown below:

In the Specification

<u>Column 1,</u>
Line 14, "Contract No. UF Project 59866" should read --Contract No. FA9550-06-1-0192--.

<u>Column 1,</u>
Line 30, "Having a" should read -- Havinga --.

<u>Column 2,</u>
Line 23, "polymeric sequence" should read -- polymeric sequences--.

<u>Column 4,</u>
Line 12, "alkenyl(aryl)amino" should read -- alkynyl(aryl)amino--.

<u>Column 5,</u>
Line 37, "Fe/Fc$^+$" should read -- Fc/Fc$^+$--.

<u>Column 9,</u>
Line 9, "diether" should read -- diester --.

<u>Column 14,</u>
Line 36,
"
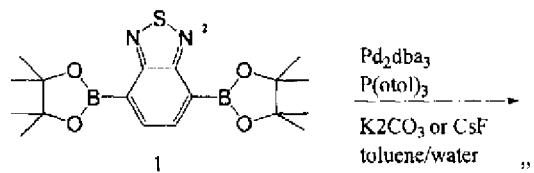
Pd$_2$dba$_3$
P(otol)$_3$
K2CO$_3$ or CsF
toluene/water
"

Signed and Sealed this
Seventeenth Day of September, 2013

*Teresa Stanek Rea*
*Deputy Director of the United States Patent and Trademark Office* should read
-- 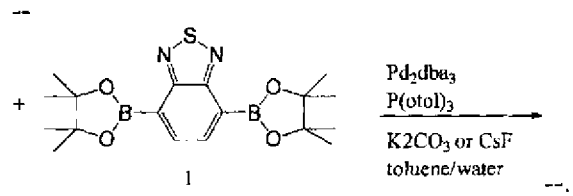 --.